United States Patent
Fujiki et al.

(10) Patent No.: US 7,335,537 B2
(45) Date of Patent: Feb. 26, 2008

(54) METHOD OF MANUFACTURING SEMICONDUCTOR DEVICE INCLUDING BONDING PAD AND FUSE ELEMENTS

(75) Inventors: Noriaki Fujiki, Tokyo (JP); Takashi Yamashita, Tokyo (JP); Junko Izumitani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/697,765

(22) Filed: Apr. 9, 2007

(65) Prior Publication Data
US 2007/0176258 A1 Aug. 2, 2007

Related U.S. Application Data

(62) Division of application No. 10/732,375, filed on Dec. 11, 2003, now Pat. No. 7,217,965.

(30) Foreign Application Priority Data

Apr. 4, 2003 (JP) ............................. 2003-101762

(51) Int. Cl.
*H01L 21/82* (2006.01)
(52) U.S. Cl. .................. 438/132; 438/215; 438/281; 438/333; 438/601; 257/E21.592
(58) Field of Classification Search ................ 438/132, 438/215, 281, 333, 467, 601, 612; 257/209, 257/529, E21.592
See application file for complete search history.

(56) References Cited

U.S. PATENT DOCUMENTS 5,360,988 A 11/1994 Uda et al.

6,563,188 B2 5/2003 Nagatani
6,656,826 B2 12/2003 Ishimaru
2002/0062549 A1 5/2002 Hewson et al.
2004/0012071 A1 1/2004 Ido et al.

FOREIGN PATENT DOCUMENTS

JP 2002-110799 A 4/2002
JP 2002-203902 A 7/2002

*Primary Examiner*—Thien F Tran
(74) *Attorney, Agent, or Firm*—Leydig, Voit & Mayer, Ltd.

(57) ABSTRACT

A method of manufacturing a semiconductor device includes forming a first insulating film supported by a semiconductor substrate, forming an aluminum layer supported by the first insulating film, etching the aluminum layer to form a bonding pad and fuse elements, depositing by plasma chemical vapor deposition a second insulating film covering the bonding pad and the fuse elements, the second insulating film having planar portions between the fuse elements and ridged portions opposite the fuse elements, depositing by plasma chemical vapor deposition a third insulating film covering the second insulating film, etching the third insulating film to form a first hole exposing a first region of the second insulating film, opposite the fuse elements, and a second hole exposing a second region of the second insulating film, opposite at least part of said bonding pad, and etching the second insulating film to form a third hole exposing at least part of the bonding pad.

3 Claims, 14 Drawing Sheets

METHOD OF MANUFACTURING SEMICONDUCTOR DEVICE INCLUDING BONDING PAD AND FUSE ELEMENTS

BACKGROUND OF THE INVENTION

1. Field of the Invention

The present invention relates to a semiconductor device. More specifically, the present invention relates to a semiconductor device having a portion used as a fuse.

2. Background Art

In recent years, accompanying the miniaturization, and increase in the capacity and speed of semiconductor devices, a rescuing method for securing the yield is taken in a semiconductor manufacturing process wherein spare memory cells are previously prepared in a semiconductor device, and when a defective bit is found, the defective bit is replaced by a spare memory cell. As the method for replacing the defective bit to a spare memory cell, a method wherein the portion to be used as a fuse is previously provided in a wiring layer, and a program to blow the fuse, whereby to transmit a signal to use the spare memory cell, is provided.

As a method to blow the fuse, the laser trimming system wherein laser beams are radiated onto the fuse is widely used. In this case, in general, YAG laser or YLF laser is often used to radiate laser beams.

As the material for the fuse wiring, Al, which has relatively low melting point and boiling point, is suited. The wiring used as a fuse is often formed utilizing the wiring layer used in the formation of other wirings. On the other hand, in order to form fine wirings and to reduce the wiring resistance, Cu wirings have often been used. However, since Cu has higher melting point and boiling point than Al, blowing using conventional YAG or YLF laser is difficult, and when a conventional blowing method is used, it is difficult that a Cu wiring is used as a fuse.

It is also difficult to perform Au or Al wire bonding on a Cu wiring, and Al is generally used for the uppermost wiring layer that forms the portion used as the bonding pad. A passivation film for protecting the surface of a semiconductor chip is also formed on the uppermost Al wiring, and a silicon nitride film is often used as the passivation film.

It has generally known that when an Al wiring is blown using laser beams, the Al wiring is easily cut when a silicon oxide film is formed on the Al wiring. On the other hand, since a silicon nitride film absorbs much laser beams, and has a high melting point, the blow of the Al wiring in the silicon nitride film may produce blow residues, and cannot be performed properly.

Therefore, when a silicon nitride film is used as the passivation film, it is difficult to use the Al wiring in the uppermost layer as the fuse wiring. For this reason, an Al wiring is normally formed in the silicon oxide film formed below the uppermost wiring layer to used as the fuse wiring. Generally, in order to constitute a fuse wiring, at least two layers of Al wiring layers, that is, an Al wiring layer for the bonding pad, and an Al wiring layer for the fuse formed in the silicon oxide film, are required. However, the structure wherein an insulating film is formed between the two Al wiring layers is apt to be cracked by the vibration when the wires are fixed to the bonding pad.

Although a silicon nitride film or a silicon oxide film is normally formed using a P-CVD method, the adjacent fuses may be damaged when a fuse is blown because a thin film formed using a P-CVD method is the lacking in flatness.

On the other hand, in order to use an Al wiring on the uppermost layer, and to blow the Al wiring properly, it is considered to make the Al wiring thin. The Al wiring is normally formed so as to have a thickness of 600 to 800 nm; however, if the thickness of the Al wiring is as thin as 100 to 400 nm, it is easily blown even if the Al wiring is present in the silicon nitride film. However, the reduction of the thickness of the Al wiring may lead to the deterioration of the bonding characteristics of the bonding pad, and cracks may occur in the interlayer insulating film under the Al wiring during bonding or testing, the bonding strength may lower, and the pad may be delaminated. Therefore, simply thinning the Al wiring is not preferable (e.g., refer to Patent References of Japanese Patent Laid-Open No. 2002-203902 and of Japanese Patent Laid-Open No. 2002-110799).

SUMMARY OF THE INVENTION

Therefore, the present invention proposes an improved semiconductor device and a method for manufacturing such a semiconductor device so as to inhibit damage to the adjacent fuse, and to ensure that the only the target fuse is blown.

According to one aspect of the present invention, a semiconductor device comprises a lower-layer substrate including at least one metal layer, a fuse formed above the lower-layer substrate, a silicon oxide film formed on the fuse and on the exposed portion of the surface of the lower-layer substrate, and a silicon nitride film formed on the silicon oxide film. The fuse is the top of metal layers in the semiconductor device and is formed from metal including Al. The portion of the silicon oxide film formed on the surface of the lower-layer substrate is thicker than the fuse. The silicon nitride film has an opening above the portion where the fuse is formed.

According to another aspect of the present invention, a semiconductor device comprises a lower-layer substrate including at least one metal layer, a fuse formed above the lower-layer substrate, and an insulating film formed on the fuse and on the exposed portion of the surface of the lower-layer substrate. The fuse is the top of metal layers in the semiconductor device and is formed from metal including Al. The insulating film includes a first insulating film and a second insulating film, and the portion of the insulating film formed on the surface of the lower-layer substrate is thicker than the fuse.

Other and further objects, features and advantages, of the invention will appear more fully from the following description.

DETAILED DESCRIPTION OF THE PREFERRED EMBODIMENTS

Figure 1:
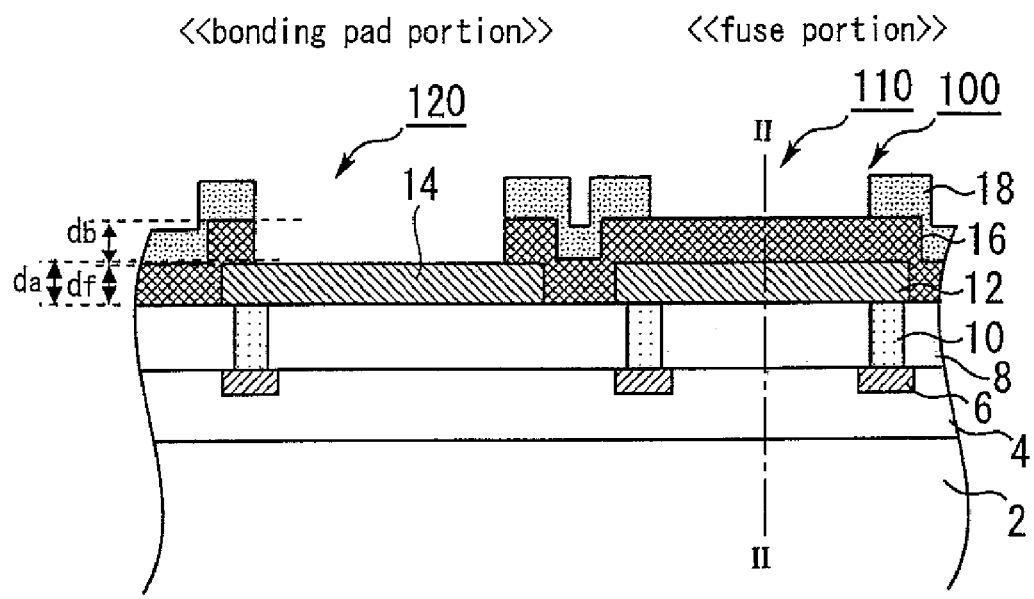
FIG. 1 is a schematic sectional view for illustrating the structure of a semiconductor device 100 in the first embodiment of the present invention.

The embodiments of the present invention will be described below referring to the drawings. In the drawings, the same or like parts will be denoted by the same reference numerals, and the description thereof will be simplified or omitted.

First Embodiment

Figure 2:
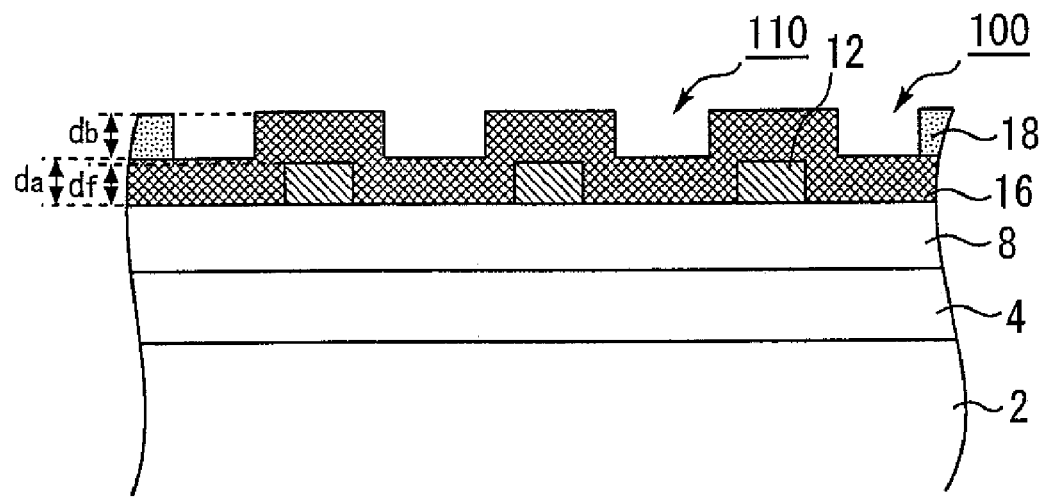
FIG. 2 is a schematic sectional view in the II-II direction of the semiconductor device 100 in FIG. 1.
Figure 3:
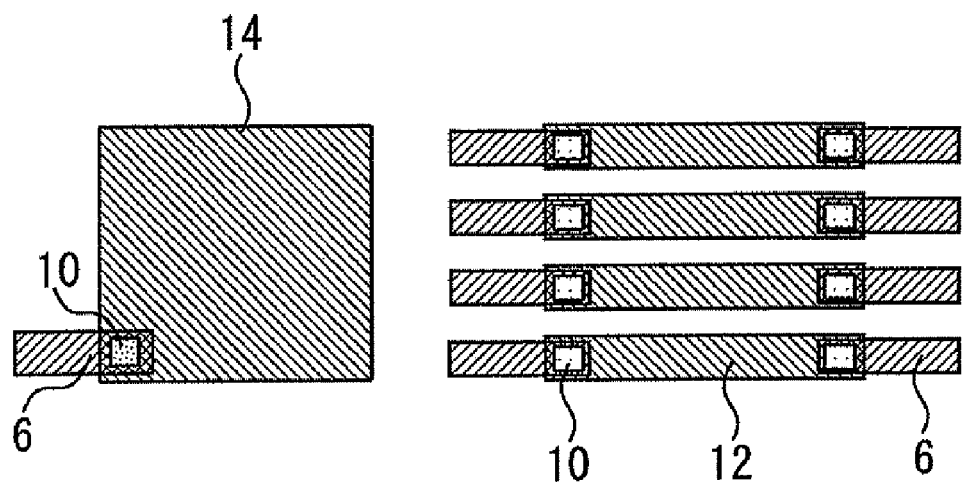
FIG. 3 is a schematic perspective top view of the wiring layers of the semiconductor device 100.
Figure 4:
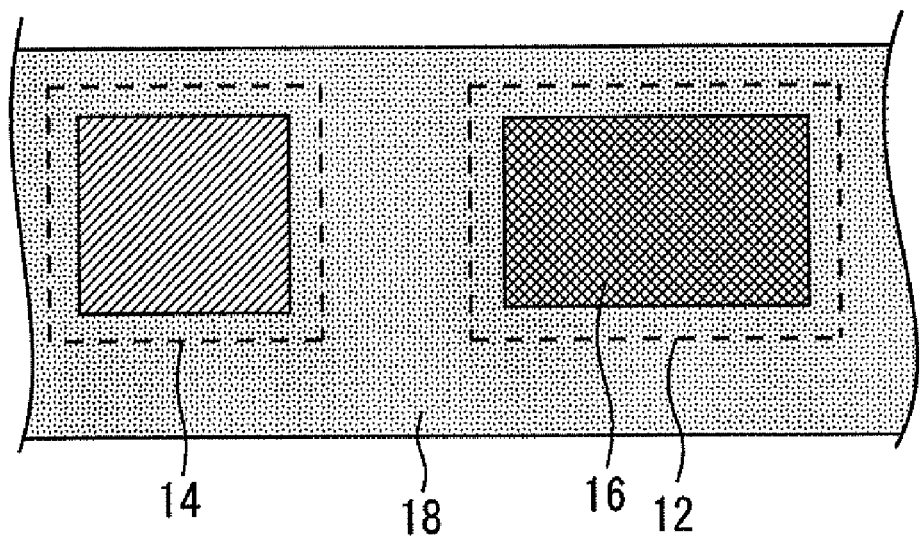
FIG. 4 is a schematic top view of the semiconductor device 100.

FIG. 1 is a schematic sectional view for illustrating the structure of a semiconductor device 100 in the first embodiment of the present invention. FIG. 2 is a schematic sectional view in the II-II direction of the semiconductor device 100 in FIG. 1. FIG. 3 is a schematic perspective top view of the wiring layers of the semiconductor device 100, and FIG. 4 is a schematic top view of the semiconductor device 100.

As FIGS. 1 and 2 show, in the semiconductor device 100, an interlayer insulating film 4 is formed on an Si substrate 2, and Cu wirings 6 are formed in the interlayer insulating film 4. An interlayer insulating film 8 is formed on the surfaces of the Cu wirings 6, and on the exposing surface of the interlayer insulating film 4. Via holes 10 that pass through the interlayer insulating film 8 are formed in the locations of the interlayer insulating film 8 corresponding to the locations of the Cu wirings 6, and are filled with tungsten.

The fuse portion 110 and the bonding-pad portion 120 of the semiconductor device 100 have a fuse wiring 12 and a bonding pad 14 formed on the interlayer insulating film 8, respectively. The fuse wiring 12 and the bonding pad 14 are Al films formed in the same step, and have the same thickness $d_f$. Specifically, the thickness $d_f$ is from approximately 400 nm to 900 nm, in the first embodiment. The width $W_a$ in FIG. 2 is from approximately 0.8 μm to 1.2 μ. As FIG. 3 shows, when the fuse wiring 12 is viewed from the above, laterally long and liner Al wiring layers, which are laterally long and narrow in the sectional direction of FIG. 1, are arranged in the depth direction (i.e., in FIG. 1, the direction vertical to the page). When the bonding pad 14 is viewed from the above, it is formed in a rectangular shape.

A silicon oxide film 16 is formed on the fuse wiring 12, the bonding pad 14, and the portion of the interlayer insulating film 8 exposed on the surface. The silicon oxide film 16 is formed along the step between the fuse wiring 12 and the bonding pad 14 on the surface of the interlayer insulating film 8 and has a substantially uniform thickness. Therefore, the thickness $d_a$ of the silicon oxide film 16 in the portion of the silicon oxide film 16 whereon the fuse wiring 12 is not formed, that is the portion of the silicon oxide film 16 directly contacting the interlayer insulating film 8, is equal to the thickness $d_b$ of the silicon oxide film 16 formed on the fuse wiring 12. The silicon oxide film 16 is formed so that the thickness thereof $d_a$ and $d_b$ becomes thicker than the thickness $d_f$ of the fuse wiring 12. In consideration of ease of laser trimming, a thickness difference between the thickness $d_f$ of the wiring 12 and thickness $d_a$, $d_b$ of the silicon oxide film 16 is less than approximately 400 nm.

As FIGS. 1 and 4 show, the silicon oxide film 16 has an opening in the bonding pad portion 120 formed so as to expose a part of the surface of the bonding pad 14.

A silicon nitride film 18 is formed on the silicon oxide film 16. The silicon nitride film 18 has a substantially uniform thickness throughout. In the fuse portion 110, as FIG. 4 shows, the silicon nitride film 18 has an opening in the portion whereon the fuse wiring 12 is formed. Namely, the silicon nitride film 18 is not laminated on the silicon oxide film 16 above the fuse wiring 12, but the silicon nitride film 18 is laminated only on the portion whereon the fuse wiring 12 is not formed. On the other hand, in the bonding pad portion 120, the silicon nitride film 18 has an opening formed so as to expose a part of the surface of the bonding pad 14 in the same manner as the silicon oxide film 16. From the openings formed in the silicon oxide film 16 and silicon nitride film 18, the bonding pad 14 can be connected to the wire.

Figure 5:
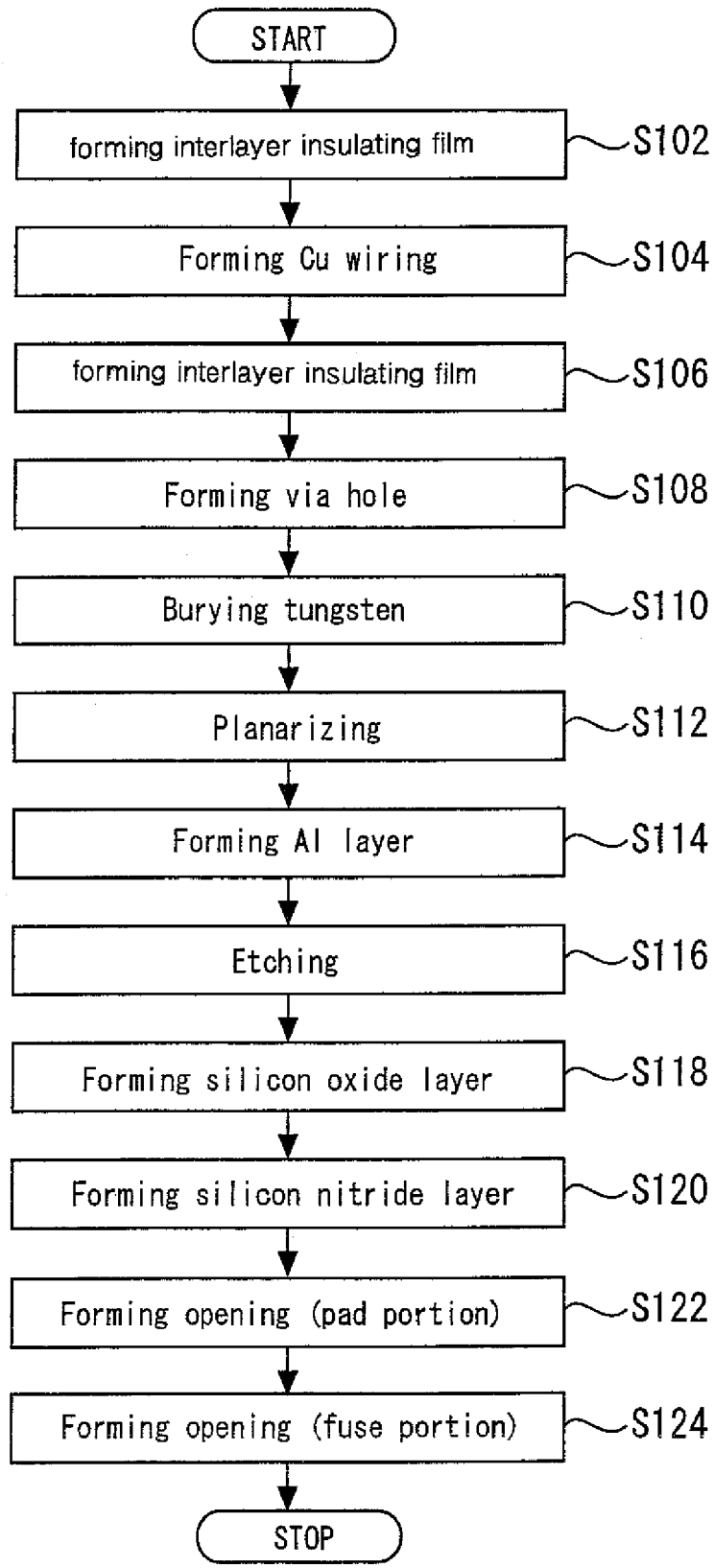
FIG. 5 is a flow diagram for illustrating the manufacturing process of the semiconductor device 100 in the first embodiment of the present invention.

FIG. 5 is a flow diagram for illustrating the manufacturing process of the semiconductor device 100 in the first embodiment of the present invention. The method for manufacturing a semiconductor device 100 in the first embodiment of the present invention will be described below referring to FIGS. 1 to 5.

First, in the normal process, an interlayer insulating film 4 is formed on an Si substrate 2 (Step S102), and Cu wirings 6 are formed in the interlayer insulating film 4 using a Damascene method (Step S104). Thereafter, an interlayer insulating film 8 is formed on the Cu wiring 6 and the interlayer insulating film 4 (Step S106), and via holes 10 are formed by etching so as to pass through the interlayer insulating film 8 to the surfaces of the Cu wirings 6 (Step S108). The via holes 10 are filled with tungsten (Step S110), and planarization by CMP (chemical mechanical polishing) is performed until the surface of the interlayer insulating film 8 is exposed (Step S112).

Next, an Al film is formed on the tungsten in the via holes 10 and the interlayer insulating film 8 (Step S114). The Al film is formed so as to be from approximately 400 nm to 900 nm thick. Then, the Al film is etched (Step S116), and fuse wirings 12 are formed in the fuse portion 110 and bonding pads 14 are formed in the bonding pad portion 120.

Next, a silicon oxide film 16 is formed (Step S118). Here, a P-CVD (plasma chemical vapor deposition) method is used. Thereby, the step of the lower-layer base material, that is, the step formed by fuse wirings 12 and the bonding pad 14 formed on the interlayer insulating film 8, is almost correctly reflected to form a conformal silicon oxide film having a uniform thickness $d_a$ and $d_b$.

Next, a silicon nitride film 18 is formed on the silicon oxide film 16 (Step S120). Here, the silicon nitride film 18 is formed using a P-CVD method, and becomes a film on a uniform thickness almost correctly reflecting the step of the surface of the silicon oxide film 16. The silicon oxide film 16 is formed so that the thickness difference between the thickness $d_a$, $d_b$ of the silicon oxide film 16 and the thickness $d_f$ of the fuse wiring 12 is thinner than approximately 400 nm or so.

Next, openings are formed in the silicon nitride film 18 and the silicon oxide film 16 (Steps S122 and S124). Specifically, and in the bonding pad portion 120, openings are formed in the silicon nitride film 18 and the silicon oxide film 16 above the bonding pad 14 so that a part of the bonding pad 14 is exposed (Step S122). Thereafter, an opening is formed in the fuse portion 110 by etching so that the surface of the silicon oxide film 16 is exposed above the fuse wirings 12 (Step S124).

As described above, the semiconductor device 100 is formed.

According to the first embodiment, as described above, the fuse wiring 12 can be formed using the wiring layer formed in the uppermost layer of the Al wiring layers formed to form the bonding pad 14, that is, the wiring layer formed in the semiconductor device 100. Also, this Ai wiring is embedded in the silicon oxide film 16. Here, although the silicon nitride film 18 is laminated on the silicon oxide film 16, since the silicon nitride film 18 has an opening on the portion where of the fuse wiring 12 is formed, and the silicon nitride film 18 is not formed on the fuse wiring 12.

According to the first embodiment, the fuse wiring 12 is an Al wiring formed in the uppermost layer of wiring layers, and since the fuse wiring 12 is buried in the silicon oxide film 16, the silicon nitride film 18 is not formed on the fuse wiring 12. Therefore, the fuse wiring 12 can be easily blown inhibiting the formation of blow residues.

Since the uppermost Al wiring can be utilized as a fuse, there is no need to form another layer of the Al layer underneath the uppermost Al wiring. Therefore, the formation of the structure having an insulating film sandwiched between Al wirings can be avoided, and cracking during wire bonding can be inhibited. There is no need to form two layers of Al wirings in order to form the fuse, and the Al layer used for forming the bonding pad 14 can also be used for forming the fuse wiring 12. Therefore, the size of the entire semiconductor device 100 can be reduced, and the throughput in the manufacture of semiconductor devices can be improved.

Although the silicon nitride film 18 has openings on the fuse wiring 12 and on the bonding pad 14, other portions of the semiconductor device 100 are covered with the silicon nitride film 18. Therefore, the infiltration of moisture into the chip can be prevented, and the reliability of the semiconductor device 100 can be secured.

In the first embodiment, the thickness $d_a$ of the silicon oxide film 16 is thicker than the thickness $d_f$ of the fuse wiring 12. Thereby, when the fuse wiring 12 is blown, damage to other adjacent fuse wirings can be prevented.

In the first embodiment, there was described the case where the fuse wiring 12, the silicon oxide film 16 and the like are formed on the lower-layer substrate wherein the interlayer insulating film 4, the Cu wiring 6, and the interlayer insulating film 8 are formed on the Si substrate 2. However, the present invention is not limited thereto, but other structures may also be used. Also, the layer whereon the fuse wiring 12 is formed is not limited to the layer whereon the bonding pad 14 is formed.

Also in the first embodiment, there was described the case where the fuse wiring 12 is constructed of Al. However, the fuse wiring in the present invention is not limited thereto, but other material may also constitute the fuse wiring. For example, the fuse wiring is constructed of metal including Ti, Ta, Cu or the like. Further, the fuse wiring may be constructed of lamination layer of metal films.

Also in the first embodiment, there was described the case where the thickness $d_f$ of the fuse wiring 12 is from approximately 400 to 900 nm and where the thickness $d_a$, $d_b$ of the silicon oxide film is thicker by approximately 400 nm or less than the thickness $d_f$. However, the thickness $d_f$, $d_a$ and $d_b$ in the present invention is limited thereto. In consideration of ease in fuse trimming or the like, the thickness of them may be decided, suitably. Provided that if a layer including Al existed under the fuse wiring 12, the thickness of the fuse wiring 12 is preferably thicker than that of the layer including Al.

Also in the first embodiment 1, there was described the case where the silicon oxide film 16 and the silicon nitride film 18 are formed using a P-CVD method. However, the present invention is not limited to the use of a P-CVD method, but these may be formed using other methods.

Second Embodiment

Figure 6:
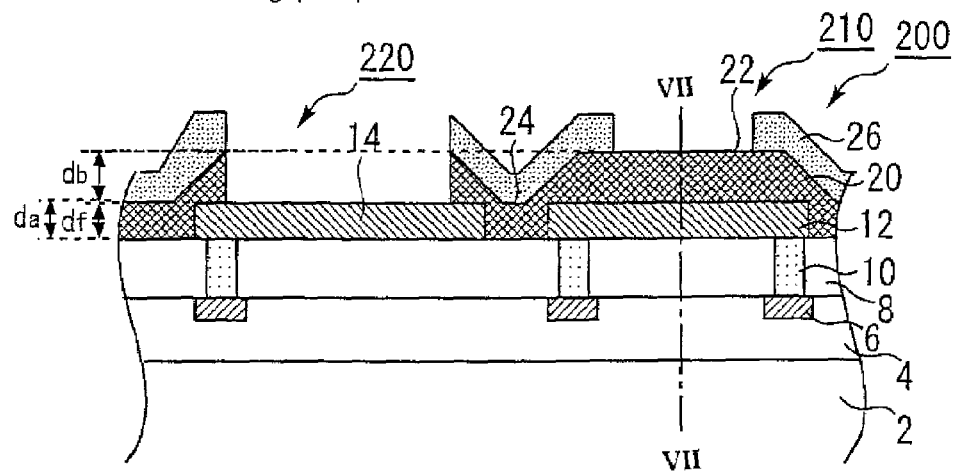
FIG. 6 is a schematic sectional view for illustrating a semiconductor device 200 in the second embodiment of the present invention.
Figure 7:
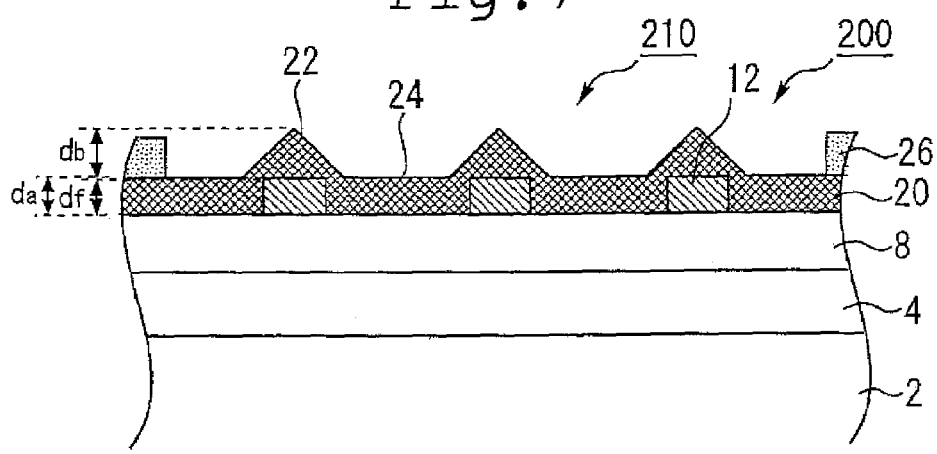
FIG. 7 is a schematic diagram showing the cross section of the semiconductor device 200 in FIG. 6 in the VII-VII direction.

FIG. 6 is a schematic sectional view for illustrating a semiconductor device 200 in the second embodiment of the present invention. FIG. 7 is a schematic diagram showing the cross section of the semiconductor device 200 in FIG. 6 in the VII-VII direction.

As FIGS. 6 and 7 show, the semiconductor device 200 resembles the semiconductor device 100. Also in the semiconductor device 200, an interlayer insulating film 4 is formed on an Si substrate 2, Cu wirings 6 are buried on the interlayer insulating film 4, furthermore, an interlayer insulating film 8 is formed on the interlayer insulating film 4 and the Cu wirings 6, and via holes 10 filled with tungsten are formed in the interlayer insulating film 8. Also in the fuse portion 210, a fuse wiring 12 is formed, and in the bonding pad portion 220, a bonding pad 14 is formed. The fuse wiring 12 and the bonding pad 14 has the same thickness $d_f$ as in the first embodiment.

As in the semiconductor device 100, a silicon oxide film 20 is formed on the fuse wiring 12 and the bonding pad 14, and the portion of the interlayer insulating film 8 exposed on the surface. However, unlike the semiconductor device 100, the silicon oxide film 20 has a ridged portion 22 formed on the fuse wiring 12, and a flat portion 24 having a flat surface formed on the interlayer insulating film 8. The thickness of the flat portion 24 is $d_a$. The thickness from near the peak of the ridged portion 22 to the surface of the fuse wiring 12 is $d_b$. The thickness $d_a$ is substantially the same as the thickness $d_b$, and is somewhat thicker than the thickness $d_f$ of the fuse wiring 12. Also as in the first embodiment, the silicon oxide film 20 has an opening on the bonding pad 14.

On the silicon oxide film 20, a silicon nitride film 26 is formed in a uniform thickness almost correctly reflecting the step of the surface of the silicon oxide film 20. Namely, the surface of the silicon nitride film 26 is ridged on the ridged portion 22 on the silicon oxide film 20, and is flat on the flat portion 24. Also as in the first embodiment, the silicon nitride film 26 has openings on the opening portion of the silicon oxide film 20 on the bonding pad 14, and the portion whereon the fuse wiring 12 is formed.

Next, a method for manufacturing the semiconductor device 200 in the second embodiment of the present invention will be described.

First, as described for the first embodiment, by performing steps S102 to S116, the state wherein the fuse wiring 12 is formed in the fuse portion 210, and the bonding pad 14 is formed in the bonding pad portion 220 is completed.

Next, as in the first embodiment, a silicon oxide film 20 is formed. In the second embodiment, however, the P-CVD method used in the first embodiment is not used, but an HDP-CVD (high density plasma chemical vapor deposition) method is used. The HDP-CVD method is a method for forming a film by using high-density plasma while impressing a high voltage to a CVD apparatus. Unlike conventional P-CVD wherein a conformal film is formed correctly reflecting the step of the lower-layer base material, in the HDP-CVD method, etching is performed simultaneously with film forming at the corners (shoulders) of the step, that is, the portion with a steep angle. As a result, as FIGS. 6 and 7 show, a diagonally inclined film is formed on the portion having a step in the lower layer, and particularly on a fine fuse wiring 12, a triangularly ridged shape is formed.

Next, in the same manner as the first embodiment, a silicon nitride film 26 is formed on the silicon oxide film 20 using a P-CVD method (Step S120). The silicon nitride film 26 is correctly reflected to the step of the lower layer, and becomes a thin film having a uniform thickness.

Furthermore, as in the first embodiment, openings are formed in the silicon nitride film 26 and the silicon oxide film 20 (Steps S122, S124). Specifically, the silicon nitride film 26 and the silicon oxide film 20 on the bonding pad 14 are etched to form the openings. Thereafter, the silicon nitride film 26 above the fuse wirings 12 is etched to form an opening.

As described above, the semiconductor device 200 is formed.

In the second embodiment as described above, the silicon oxide film 20 has a ridged portion 22 and a flat portion 24. The ridged portion 22 is formed on the fuse wiring 12, and continuing to the ridged portion 22, the flat portion 24 is formed on the interlayer insulating film 8 whereon the fuse wiring 12 is not formed. Thereby, the side portion of the fuse wiring 12 can be covered with the silicon oxide film 20, while the entire thickness of the silicon oxide film 20 on the fuse wiring 12 can be thinned. Therefore, fuse blow can be performed surely, and damage to adjacent fuses can be inhibited.

In the second embodiment, the silicon oxide film 20 has a ridged portion 22 on the fuse wiring 12. Accordingly, the laser beams for blowing the fuse wiring can be refracted at the ridged portion 22 and concentrated on the surface of the fuse wiring 12. Therefore, the fuse to be blown can be blown more securely without damaging adjacent fuses.

In the second embodiment also, as in the first embodiment, the fuse wiring 12 is an Al wiring formed on the uppermost layer of wiring layers, and the fuse wiring 12 is buried in the silicon oxide film 20 and the silicon nitride film 26 is not formed on the fuse wiring 12. Therefore, the fuse wiring 12 can be easily blown without blow residues. In the semiconductor device 200 also, since the formation of the structure wherein an insulating film is sandwiched between Al wirings can be avoided, the size reduction and the throughput improvement of the entire semiconductor device 200 can be achieved while inhibiting cracking that may occur during wire bonding. Furthermore, in the semiconductor device 200, since the silicon nitride film 26 is formed as a passivation film on the uppermost layer, the infiltration of moisture into the chip can be prevented, and the reliability of the semiconductor device 200 can be secured.

Also in the second embodiment, the thickness $d_a$ of the silicon oxide film 20 is made thicker than the thickness $d_f$ of the fuse wiring 12. Thereby, when the fuse wiring 12 is blown, damage to adjacent other fuse wirings 12 can be inhibited.

In the second embodiment, the silicon oxide film 20 consisting of a ridged portion 22 and a flat portion 24 is formed using an HDP-CVD method. According to this method, the silicon oxide film 20 of such a shape can be easily formed; however, in the present invention, the method for forming a silicon oxide film is not limited to the HDP-CVD method described in the second embodiment.

Figure 8:
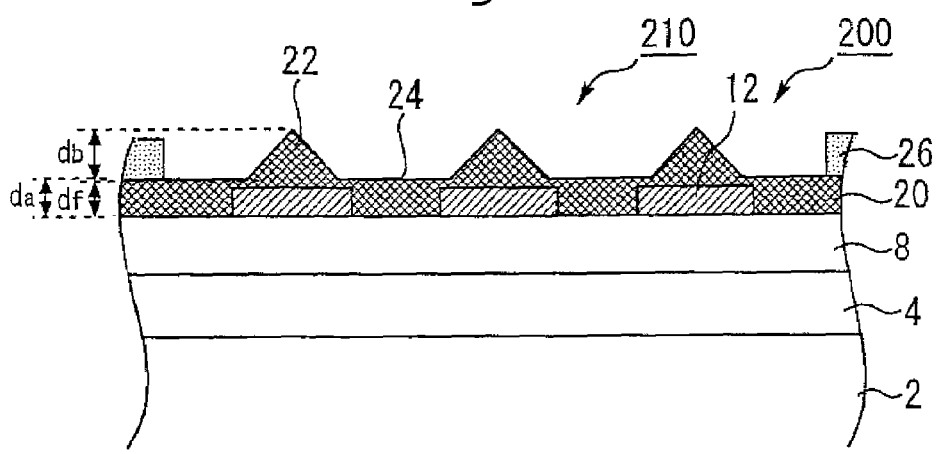
FIG. 8 is a schematic sectional view for illustrating a semiconductor device in the second embodiment of the present invention.

Also in the second embodiment, the width of the ridged portion 22 is wider than that of the fuse wiring 12 as shown in FIG. 6 and FIG. 7. However, the present invention is not limited there to, but the width of the ridged portion 22 may be narrower than that of the fuse wiring as shown in FIG. 8.

Since other parts are same as in the first embodiment, the description thereof will be omitted.

Third Embodiment

Figure 9:
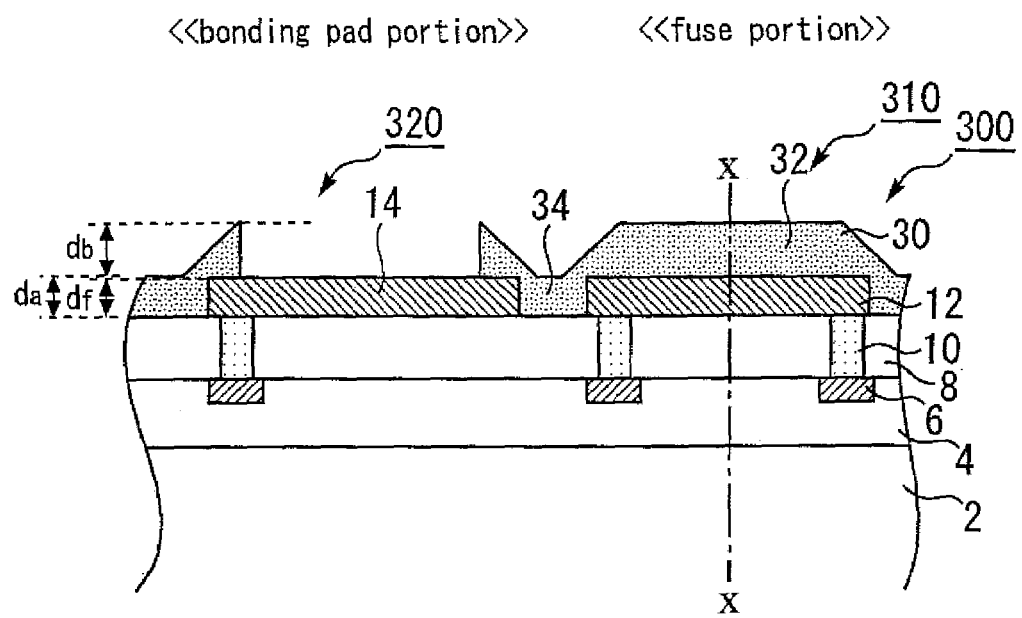
FIG. 9 is a schematic sectional view for illustrating a semiconductor device 300 in the third embodiment of the present invention.
Figure 10:
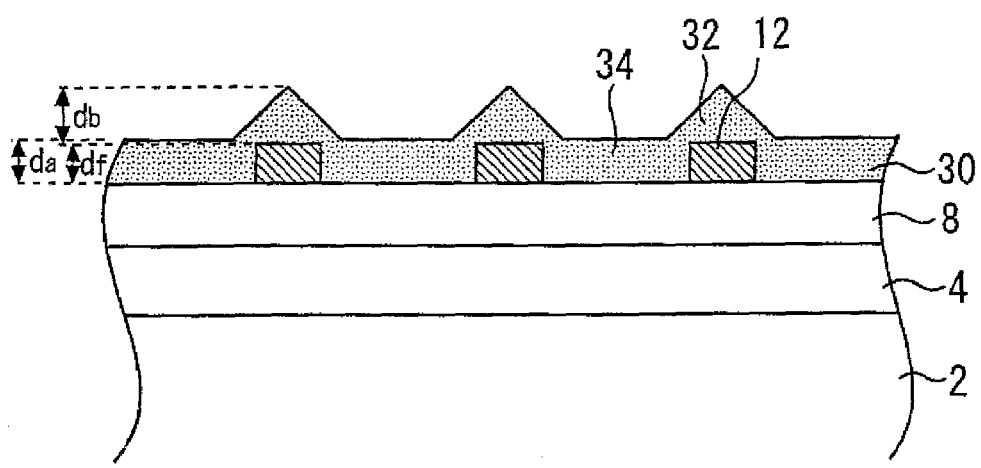
FIG. 10 is a schematic diagram showing the cross section of the semiconductor device 300 in FIG. 9 in the X-X direction.

FIG. 9 is a schematic sectional view for illustrating a semiconductor device 300 in the third embodiment of the present invention. FIG. 10 is a schematic diagram showing the cross section of the semiconductor device 300 in FIG. 9 in the X-X direction;

As FIGS. 8 and 9 show, the semiconductor device 300 in the third embodiment resembles the semiconductor device 200 described in the second embodiment. Similar to the semiconductor device 200, the semiconductor device 300 also includes an Si substrate 2, an interlayer insulating film 4, Cu wirings 6, an interlayer insulating film 8, and via holes 10 filled with tungsten. Also in the fuse portion 310, a fuse wiring 12 is formed, and in the bonding pad portion 320, a bonding pad 14 is formed. The fuse wiring 12 and the bonding pad 14 have the same thickness $d_f$ as in the first embodiment.

However, unlike the semiconductor device 200, a silicon nitride film 30 is directly formed in place of the silicon oxide 20 on the fuse wiring 12, the bonding pad 14, and the portion of the interlayer insulating film 8 exposed to the surface. The silicon nitride film 30 has a ridged portion 32 formed on the fuse wiring 12, and a flat portion 34 having a flat surface formed on the interlayer insulating film 8. The thickness of the flat portion 34 is $d_a$. The thickness of the ridged portion 32 between the vicinity of the peak and the surface of the fuse wiring 12 is $d_b$. The thickness $d_a$ is equal to the thickness $d_b$, and is somewhat thicker than the thickness $d_f$ of the fuse wiring 12. An opening is formed in the silicon nitride film 30, so that a part of the surface of the bonding pad 14 is exposed.

Figure 11:
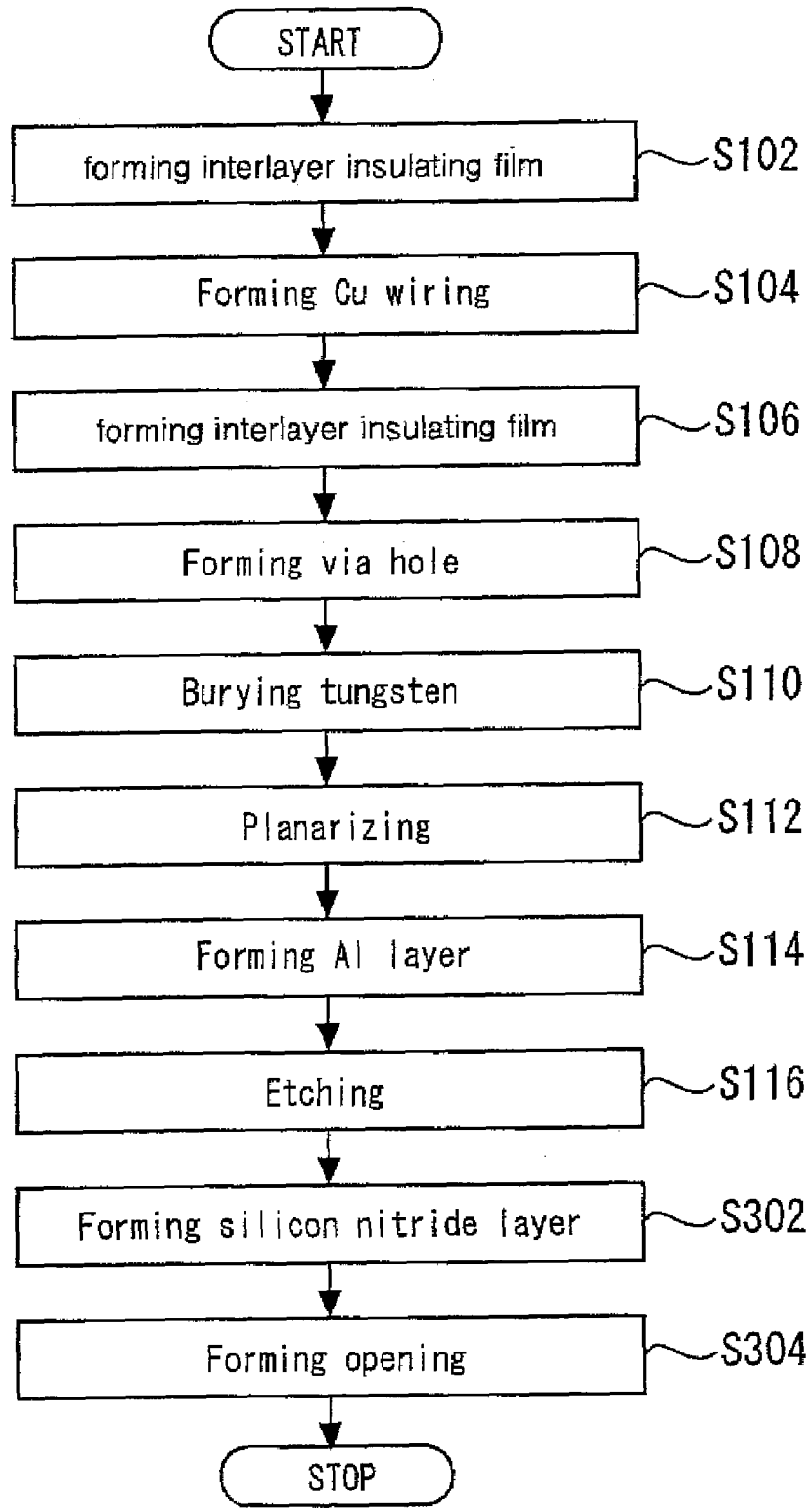
FIG. 11 is a flow diagram for illustrating the method for manufacturing the semiconductor device 300.

FIG. 11 is a flow diagram for illustrating the method for manufacturing the semiconductor device 300.

The method for manufacturing the semiconductor device 300 in the third embodiment of the present invention will be described below referring to FIGS. 8 to 10.

First, in the same manner described in the second embodiment, by performing steps S102 to S116, the state wherein the fuse wiring 12 is formed in the fuse portion 310, and the bonding pad 14 is formed in the bonding pad portion 320 is completed.

Here, in place of the silicon oxide film 20 in the second embodiment, a silicon nitride film 30 is formed (Step S302). The silicon nitride film 30 is also formed using an HDP-CVD method. When the HDP-CVD method is used, etching is performed simultaneously with film forming at the corners (shoulders) of the step, that is, the portion with a steep angle. As a result, as FIGS. 8 and 9 show, a diagonally inclined film is formed on the portion having a step in the lower layer, and particularly on a fine fuse wiring 12, a triangularly ridged shape is formed.

Next, an opening is formed in the silicon nitride film 30 so that a part of the surface of the bonding pad 14 is exposed (Step S304). Thereby, the semiconductor device 300 is formed. Unlike the first and the second embodiments, no openings are formed in the portion of the silicon nitride film 30 present on the fuse wiring 12.

According to the third embodiment, as described above, the silicon nitride film 30 is directly formed on the fuse wiring 12. As described above, if a silicon nitride film is formed on the Al wiring as usual, laser beams are absorbed in the silicon nitride film; therefore, fuse blow may be failed. However, when the ridged silicon nitride film 30 is formed on the fuse wiring 12 using an HDP-CVD method, the entire thickness of the silicon nitride film 30 on the fuse wiring 12 can be thinned. Therefore, fuse blow can be performed easily and properly.

Also in the third embodiment, the thickness $d_a$ of the silicon nitride film 30 is made thicker than the thickness $d_f$ of the fuse wiring 12. Also, since the silicon nitride film 30 has higher film stress and film density than the silicon oxide layer, a larger effect for inhibiting damage to adjacent fuses due to compression from the side of the fuse wiring 12. Therefore, as a result, good fuse-blow properties can be obtained.

Also in the semiconductor device 300, since the silicon nitride film 30 formed on the uppermost layer functions as a passivation film, the infiltration of moisture into the chip can be prevented, and the reliability of the semiconductor device 300 can be secured.

According to the third embodiment, only the silicon nitride film 30 is formed on the fuse wiring 12. Therefore, there is no need to form a passivation film consisting of a silicon nitride film separately as in the case when the silicon oxide film is formed. Therefore, the manufacturing process of the semiconductor device can be simplified, and the throughput can be improved.

Also in the third embodiment, the fuse wiring 12 is an Al wiring formed on the uppermost layer of the wiring layers, the formation of the structure wherein an insulating film is sandwiched between Al wirings can be avoided. Therefore, the size reduction and the throughput improvement of the entire semiconductor device 300 can be achieved while inhibiting cracking that may occur during wire bonding.

Since other parts are same as in the second embodiment, the description thereof will be omitted.

Fourth Embodiment

Figure 12:
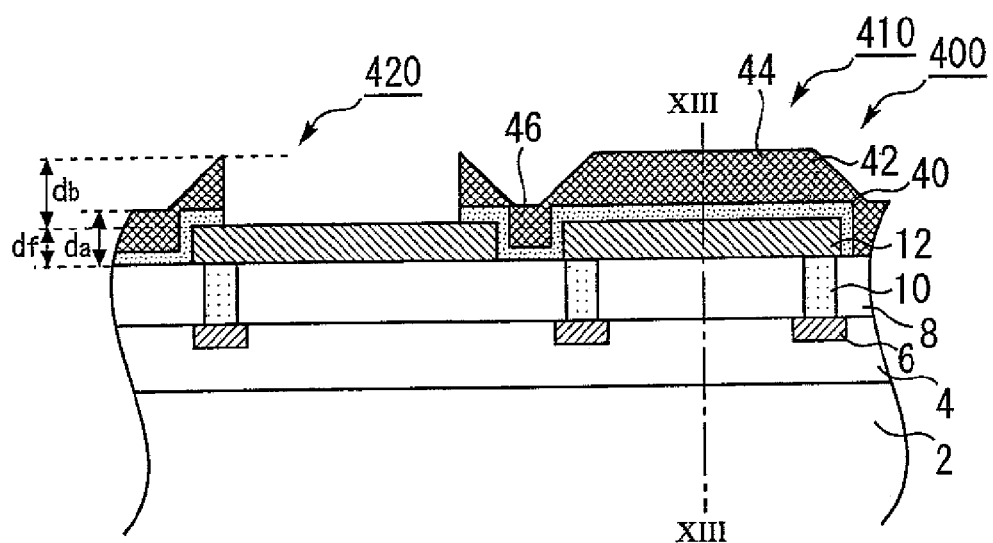
FIG. 12 is a schematic sectional view for illustrating a semiconductor device 400 in the fourth embodiment of the present invention.
Figure 13:
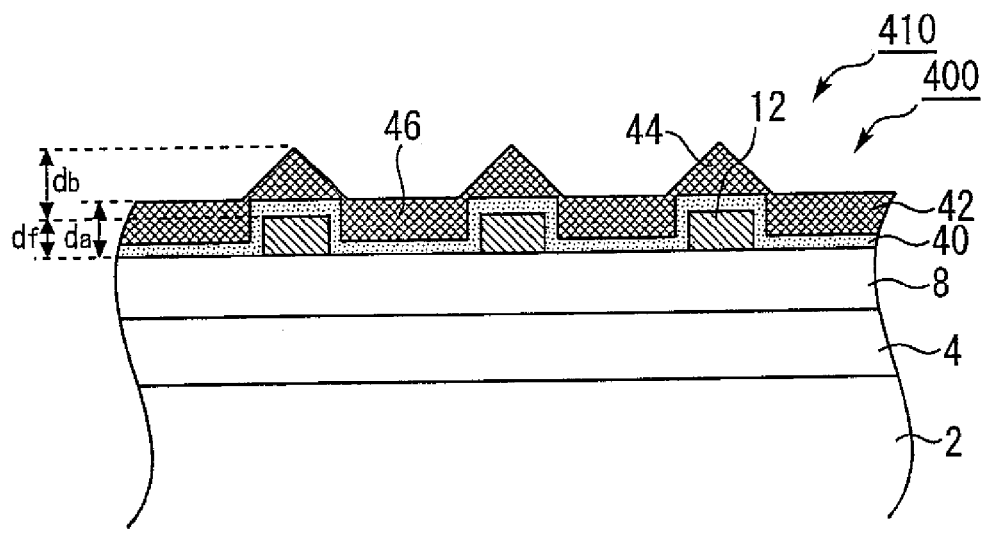
FIG. 13 is a schematic diagram showing the cross section of the semiconductor device 400 in FIG. 12 in the XIII-XIII direction.

FIG. 12 is a schematic sectional view for illustrating a semiconductor device 400 in The fourth embodiment of the present invention. FIG. 13 is a schematic diagram showing the cross section of the semiconductor device 400 in FIG. 12 in the XIII-XIII direction.

The semiconductor device 400 in the fourth embodiment resembles the semiconductor device 300 described in the third embodiment. Similar to the semiconductor device 300, the semiconductor device 400 also includes an Si substrate 2, an interlayer insulating film 4, Cu wirings 6, an interlayer insulating film 8, and via holes 10 filled with tungsten. In the fourth embodiment, F-doped silicon oxide (SiOF) film is especially used as entire or a part of the interlayer insulating film 8 or the interlayer insulating film 4.

As in the semiconductor device 300, a fuse wiring 12 is formed in the fuse portion 410, and a bonding pad 14 is formed in the bonding pad portion 420. The fuse wiring 12 and the bonding pad 14 have the same thickness $d_f$ as in the first embodiment.

In the semiconductor device 400, unlike the semiconductor device 300, a silicon oxide film 40 is formed on the fuse wiring 12, the bonding pad 14, and the portion of the interlayer insulating film 8 exposed to the surface. The silicon oxide film 40 in the semiconductor device 400 has a uniform thickness, and has a shape along the step formed in the fuse wiring 12. Also, the silicon oxide film 40 is a thin film thinner than the thickness $d_f$ of the fuse wiring 12.

In the semiconductor device 400, a silicon nitride film 42 is formed on the silicon oxide film 40. The silicon nitride film 42 a ridged portion 44 on the fuse wiring 12, and a flat portion 46 on the interlayer insulating film 8.

Here, the total thickness of the insulating films formed on the interlayer insulating film 8, that is the total thickness of the silicon oxide film 40 and the flat portion 46 of the silicon nitride film 42, is $d_a$. The total thickness of the insulating films formed on the fuse wiring 12, that is the total thickness of the silicon oxide film 40 and the ridged portion 44 of the silicon nitride film 42 at the thickest portion, is $d_a$. The film thickness $d_a$ is substantially equal to the film thickness $d_b$, and is somewhat thicker than the thickness $d_f$ of the fuse wiring 12.

The silicon oxide film 40 and the silicon nitride film 42 have openings in the portion whereon the bonding pad 14 is formed, and from this portion, the connection of wires can be performed.

The method for manufacturing the semiconductor device 400 resembles to the method for manufacturing the semiconductor device 300. Specifically, by first performing steps S102 to S116, the fuse wiring 12 is formed in the fuse portion 410, and a bonding pad 14 is formed in the bonding pad portion 420.

Next, the silicon oxide film 40 is formed. Here, the silicon oxide film 40 is formed using a P-CVD method, and the film formation is completed at the stage wherein the thickness of the silicon oxide film 40 is a predetermined thickness thinner than the thickness of the fuse wiring 12. Thereby, correctly reflecting the step of the fuse wiring 12, the bonding pad 14, and the like on the interlayer insulating film 8, the silicon oxide film 40 having irregularity on the surface is formed.

Next, the silicon nitride film 42 is formed on the silicon oxide film 40. Here, the silicon nitride film 42 is formed using an HDP-CVD method. While forming the silicon nitride film 42, etching is performed simultaneously with film forming at the corners (shoulders) of the step, that is, the portion with a steep angle. As a result, as FIGS. 11 and 12 show, a diagonally inclined film is formed on the portion having a step in the lower layer, and particularly on a fine fuse wiring 12, a triangularly ridged shape is formed.

Next, as in the third embodiment, openings are formed in the silicon oxide film 40 and the silicon nitride film 42 so that a part of the surface of the bonding pad 14 is exposed.

As described above, the semiconductor device 400 is formed.

In the fourth embodiment, as described above, a thin film consisting of the silicon oxide film 40 is formed underneath the silicon nitride film 42. The temperature of the silicon nitride film formed using an HDP-CVD method may become as high as 400° C. or above. Therefore, voids may be produced in the fuse wiring 12. Also when the F-doped silicon oxide (SiOF) film is used in all or a part of the underlying interlayer insulating film 8 or the interlayer insulating film 4 in order to lower the dielectric constant, since the silicon nitride film has a high blocking property for F, it is considered that the F diffused in the interlayer insulating film 8 may pile up on the boundary to the silicon nitride film. As a result, the blistering of delaminating of the interlayer insulating film 8 may occur. However, according to the fourth embodiment, the silicon oxide film 40 is formed between the silicon nitride film 42 and the interlayer insulating film 8. Therefore, defects such as the voids in the Al wiring and the blistering or delaminating of the interlayer insulating film 8 can be inhibited.

Also in the fourth embodiment, the total thickness $d_a$ of the silicon oxide film 40 and the silicon nitride film 42 is made thicker than the thickness $d_f$ of the fuse wiring 12. Thereby, when the fuse wiring 12 is blown, damage to adjacent other fuse wirings 12 can be inhibited.

In addition, the same effects as in the third embodiment can be obtained also in the semiconductor device 400 in the fourth embodiment.

In the fourth embodiment, the case wherein SiOF is used in all or a part of the interlayer insulating film 8 is described. This is because the silicon oxide film 40 in the fourth embodiment is formed to inhibit the blistering or delaminating of the interlayer insulating film 8 when SiOF is mainly used as described above. However, the present invention is not limited thereto, but other insulating films may be used as the interlayer insulating film 8. In this case also, a semiconductor device having a good fuse blow property can be obtained by doing as the fourth embodiment.

Since other parts are the same as those described in the third embodiment, the description thereof will be omitted.

Fifth Embodiment

Figure 14:
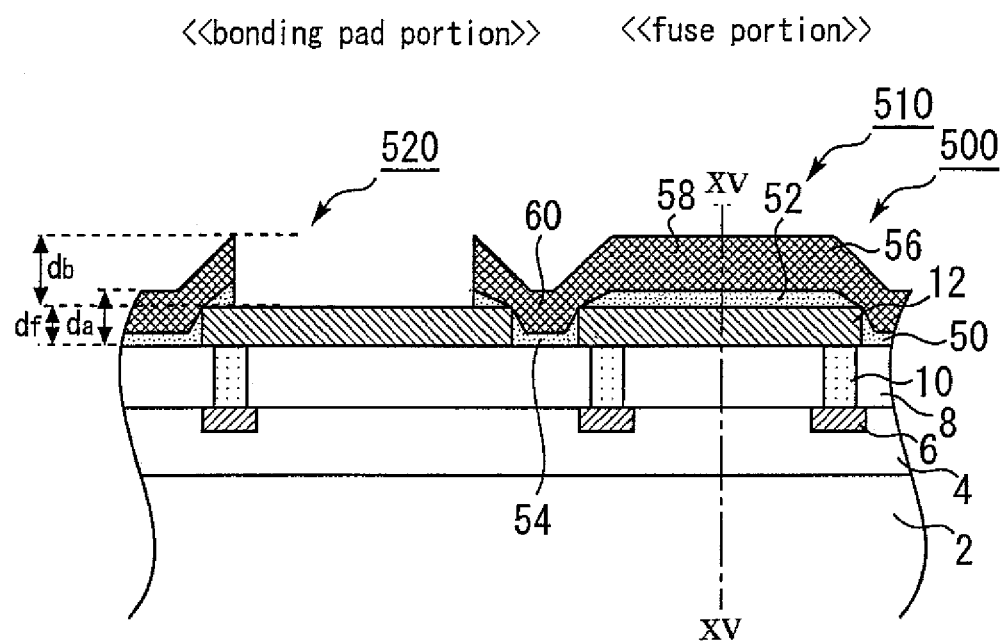
FIG. 14 is a schematic sectional view for illustrating a semiconductor device 500 in the fifth embodiment of the present invention.
Figure 15:
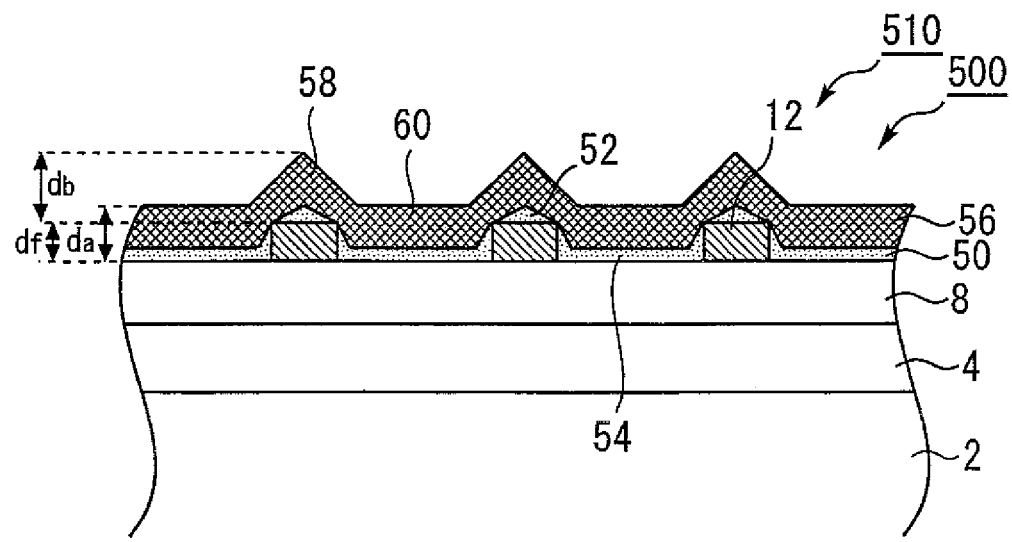
FIG. 15 is a schematic diagram showing the cross section of the semiconductor device 500 in FIG. 14 in the XV-XV direction.

FIG. 14 is a schematic sectional view for illustrating a semiconductor device 500 in the fifth embodiment of the present invention. FIG. 15 is a schematic diagram showing the cross section of the semiconductor device 500 in FIG. 14 in the XV-XV direction.

As FIGS. 13 and 14 show, the semiconductor device 500 in the fifth embodiment resembles the semiconductor device 400 described in the fourth embodiment. Similar to the semiconductor device 400, the semiconductor device 500 also includes an Si substrate 2, an interlayer insulating film 4, Cu wirings 6, an interlayer insulating film 8, and via holes 10 filled with tungsten. Also in the fuse portion 510, a fuse wiring 12 is formed, and in the bonding pad portion 520, a bonding pad 14 is formed. The fuse wiring 12 and the bonding pad 14 have the same thickness $d_f$ as in the fourth embodiment.

Also in the semiconductor device 500, as the semiconductor device 400, a silicon oxide film 50 is formed on the wiring layer whereon the fuse wiring 12 is formed. In the semiconductor device 500, however, the silicon oxide film 50 is not a thin film with a uniform thickness, but includes a ridged portion 52 formed in the vicinity of the fuse wiring 12, and a flat portion 54 on the interlayer insulating film 8. A silicon nitride film 56 is also formed on the silicon oxide film 50. The silicon nitride film 56 is also not a thin film with a uniform thickness, but includes a ridged portion 58 formed in the vicinity of the fuse wiring 12, and a flat portion 60 on the interlayer insulating film 8 as in the semiconductor device 400.

The silicon oxide film 50 and the silicon nitride film 56 has an opening to expose a part of the surface of the bonding pad 14.

The method for manufacturing the semiconductor device 500 resembles to the method for manufacturing the semiconductor device 400 described in the fourth embodiment.

Specifically, steps S102 to S116 are first performed to form the fuse wiring 12 in the fuse portion 510, and the bonding pad 14 in the bonding pad portion 520.

Next, as in the fourth embodiment, a silicon oxide film 50 is formed (Step S118). Here, the silicon oxide film 50 is formed using an HDP-CVD method. Thereby, the silicon oxide film 50 becomes a thin film including a ridged portion 52 and a flat portion 54. Here, the formation of the silicon oxide film 50 is stopped in the stage wherein the silicon oxide film 50 is thinner than the thickness $d_f$ of the fuse wiring 12. The thickest portion of the silicon oxide film 50 is still thinner than the thickness $d_f$ of the fuse wiring 12.

Next, in the same manner as described for the fourth embodiment, a silicon nitride film 56 is formed on the silicon oxide film 50 using an HDP-CVD method. The thickness of the silicon nitride film 56 is also not uniform, and the ridged portion 58 of the silicon nitride film 56 is formed on the location overlapping the ridged portion 52 of the silicon oxide film 50, and the flat portion 60 of the silicon nitride film 56 is formed. Thereafter, an opening is formed on the bonding pad 14.

Thus, the semiconductor device 500 is manufactured.

Since other parts are the same as in the fourth embodiment, the description thereof will be omitted.

According to the fifth embodiment, as described above, the silicon oxide film 50 is formed using an HDP-CVD method, and the silicon nitride film 56 is formed on the silicon oxide film 50 using an HDP-CVD method. Therefore, the total thickness of the insulating films on the fuse wiring 12 can further be thinned compared with the case wherein the silicon oxide film 50 is formed using a P-CVD method. Therefore, in the semiconductor device 500, the fuse wiring 12 can be blown more surely.

In the fifth embodiment, the case wherein both the silicon oxide film 50 and the silicon nitride film 56 having ridged portions 52, 58, and flat portions 54, 60 are formed using an HDP-CVD method. However, the present invention is not limited thereto, but films having the same shapes as the silicon oxide film 50 and the silicon nitride film 56 may be formed using other methods.

Since other parts are same as in the forth embodiment, the description thereof will be omitted.

Sixth Embodiment

Figure 16:
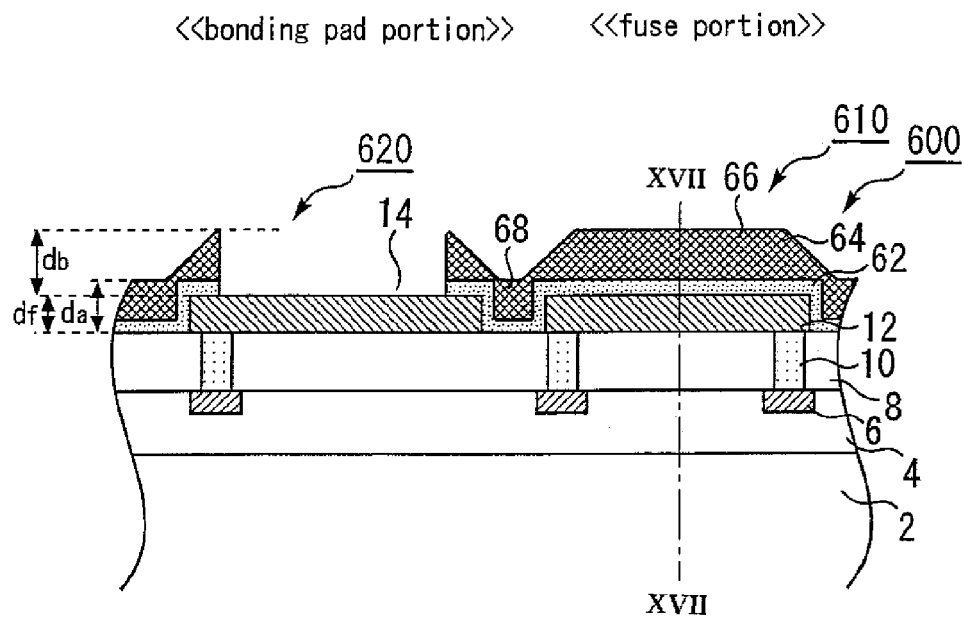
FIG. 16 is a schematic sectional view for illustrating a semiconductor device 600 in the sixth embodiment of the present invention.
Figure 17:
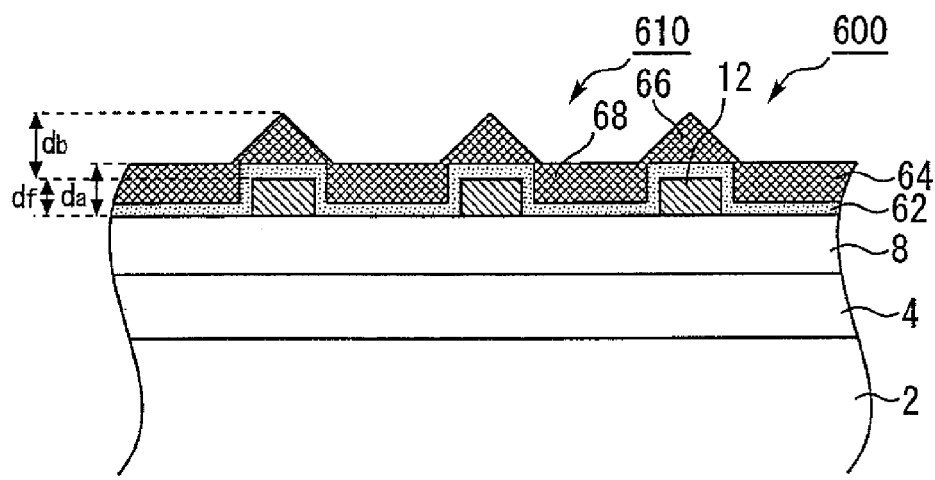
FIG. 17 is a schematic diagram showing the cross section of the semiconductor device 600 in FIG. 16 in the XVII-XVII direction.

FIG. 16 is a schematic sectional view for illustrating a semiconductor device 600 in the sixth embodiment of the present invention. FIG. 17 is a schematic diagram showing the cross section of the semiconductor device 600 in FIG. 16 in the XVII-XVII direction.

As FIGS. 15 and 16 show, the semiconductor device 600 in the sixth embodiment resembles the semiconductor device 400 described in the fourth embodiment. Similar to the semiconductor device 400, the semiconductor device 600 also includes an Si substrate 2, an interlayer insulating film 4, Cu wirings 6, an interlayer insulating film 8, and via holes 10 filled with tungsten. Also in the fuse portion 610, a fuse wiring 12 is formed, and in the bonding pad portion 620, a bonding pad 14 is formed. The fuse wiring 12 and the bonding pad 14 have the same thickness $d_f$ as in the fourth embodiment.

Also in the semiconductor device 600, as the semiconductor device 400, a silicon oxide film 62 is formed on the wiring layer whereon the fuse wiring 12 is formed along the step of the fuse wiring 12. In the semiconductor device 600, however, unlike the semiconductor device 400, a silicon oxide film 64 is further formed on the silicon oxide film 62. The silicon oxide film 64 is not a film with a uniform thickness, but includes ridged portions 66 formed on the fuse wiring 12, and a flat portion 68 formed between the ridged portions 66. The silicon oxide films 62 and 64 have an opening on the bonding pad 14.

The method for manufacturing the semiconductor device 600 resembles to the method for manufacturing the semiconductor device 400 described in the fourth embodiment. First, by performing steps S102 to S116, the fuse wiring 12 is formed in the fuse portion 610, and a bonding pad 14 is formed in the bonding pad portion 620.

Next, as in the fourth embodiment, a silicon oxide film 62 is formed using a P-CVD method. Here, the film formation is completed at the stage wherein the thickness of the silicon oxide film 62 is thinner than the thickness $d_f$ of the fuse wiring 12.

Next, a silicon oxide film 64 is further formed on the silicon oxide film 62 using an HDP-CVD method. When the HDP-CVD method is used, since the film is formed simultaneously with etching in the portion having a step, ridged portions 66 and flat portions 68 are formed in the silicon oxide film 64. Thereafter, an opening is formed in the silicon oxide films 62 and 64 to expose a portion of the surface of the bonding pad 14.

Thereby, the semiconductor device 600 is formed.

According to the sixth embodiment, as described above, the silicon oxide film 62 is a thin film with a uniform thickness formed using a P-CVD method, and the silicon oxide film 64 is formed on the silicon oxide film 62 using an HDP-CVD method. For example, when a silicon oxide film is formed directly on the interlayer insulating film 8 with a step such as the fuse wiring 12 as in the second embodiment, the shoulder on the step, such as the fuse, may be exposed. However, according to the sixth embodiment, a silicon oxide film 62 with a uniform thickness is first formed along the interlayer insulating film 8 and the overlying fuse wiring 12. Therefore, the exposure of the shoulder portion of the fuse wiring 12 is prevented, and a semiconductor device having good fuse-blow characteristics can be obtained.

In the sixth embodiment, as in the second embodiment, the silicon oxide film 64 has ridged portions 66 and flat portions 68. Thereby, a sufficient thickness is secured in the silicon oxide films 62 and 64 to cover the sides of the fuse wiring 12, and the total thickness of the silicon oxide films 62 and 64 can be thinned. Therefore, fuse blow can be securely performed, and damage to adjacent fuses can be prevented.

Also in the sixth embodiment, as in the second embodiment, the fuse wiring 12 is an Al wiring formed on the uppermost layer of the wiring layers, and the fuse wiring 12 is buried in the oxide film 62. Therefore, the fuse wiring 12 can be blown easily while minimizing the occurrence of blow residues. In the sixth embodiment, since the formation of a structure wherein an insulating film is sandwiched between Al wirings can be avoided, the size of the entire semiconductor device 600 can be reduced, and the throughput can be improved, while minimizing the occurrence of cracks during wire bonding.

In the semiconductor device 600, only silicon oxide films 62 and 64 are formed, and no silicon nitride film is formed. However, the present invention is not limited thereto, but a silicon nitride film may be formed on the uppermost layer as a passivation film as in the second embodiment. Thereby, the infiltration of moisture into the chip can be securely prevented, and furthermore, the reliability of the semiconductor device 600 can be secured.

Since other parts are same as in the forth embodiment, the description thereof will be omitted.

Seventh Embodiment

Figure 18:
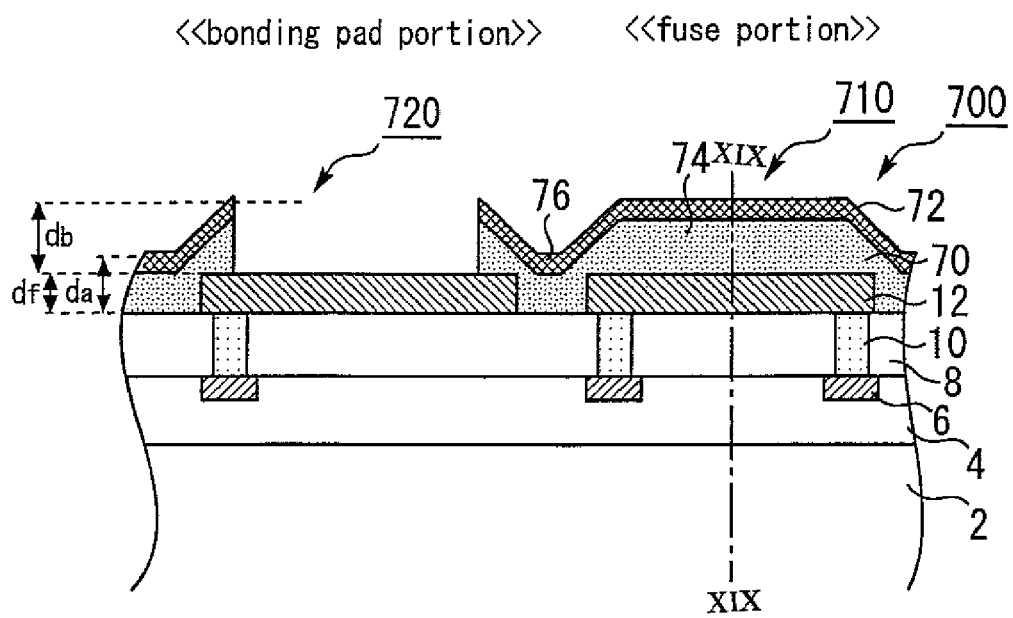
FIG. 18 is a schematic sectional view for illustrating a semiconductor device 700 in the seventh embodiment of the present invention.
Figure 19:
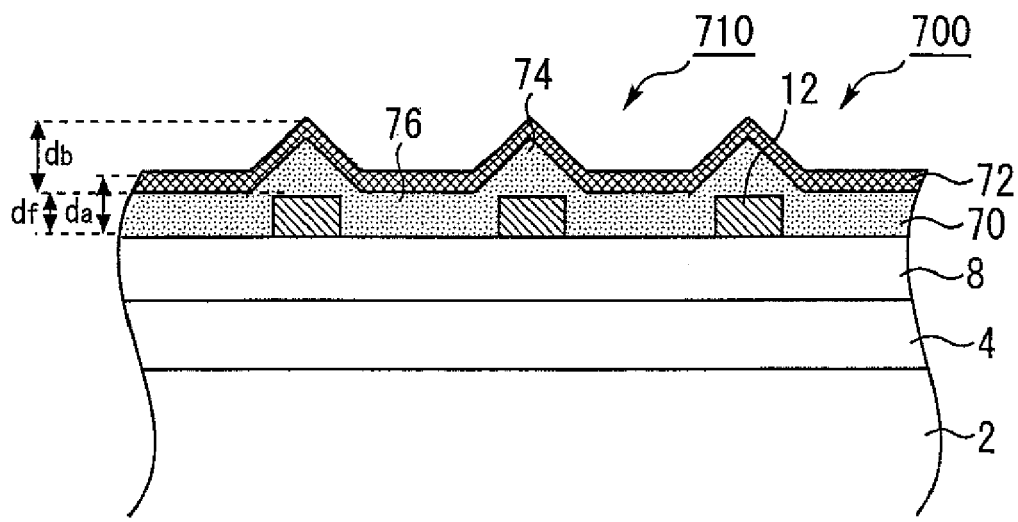
FIG. 19 is a schematic diagram showing the cross section of the semiconductor device 700 in FIG. 18 in the XIX-XIX direction.

FIG. 18 is a schematic sectional view for illustrating a semiconductor device 700 in the seventh embodiment of the present invention. FIG. 19 is a schematic diagram showing the cross section of the semiconductor device 700 in FIG. 18 in the XIX-XIX direction.

As FIGS. 17 and 18 show, the semiconductor device 700 in the seventh embodiment resembles the semiconductor device 600 described in the sixth embodiment. Similar to the semiconductor device 600, the semiconductor device 700 also includes an Si substrate 2, an interlayer insulating film 4, Cu wirings 6, an interlayer insulating film 8, and via holes 10 filled with tungsten. Also in the fuse portion 710, a fuse wiring 12 is formed, and in the bonding pad portion 720, a bonding pad 14 is formed. The fuse wiring 12 and the bonding pad 14 have the same thickness $d_f$ as in the fourth embodiment.

In the semiconductor device 700, as in the semiconductor device 600, a silicon oxide film 70 and a silicon oxide film 72 are laminated on the wiring layer whereon the fuse wiring 12 is formed. However, unlike semiconductor device 600, the underlying silicon oxide film 70 is not a film with a uniform thickness; that is, a film having ridged portions 74 and flat portions 76, and the overlying silicon oxide film 72 is a film with a uniform thickness. The silicon oxide films 70 and 72 have an opening on the bonding pad 14.

The method for manufacturing the semiconductor device 700 resembles the method for manufacturing the semiconductor device 600 described in the sixth embodiment.

Specifically, as in the sixth embodiment, by first performing steps S102 to S116, the fuse wiring 12 is formed in the fuse portion 710, and a bonding pad 14 is formed in the bonding pad portion 720.

Next, as in the sixth embodiment, a silicon oxide film 70 is formed. However, unlike the sixth embodiment, the silicon oxide film 70 having ridged portions 74 and flat portions 76 is formed using an HDP-CVD method.

Next, a silicon oxide film 72 is formed on the silicon oxide film 70 using a P-CVD method. Here, the silicon oxide film 72 is a film with a uniform thickness, and is formed along the ridged portions 74 and the flat portions of the underlying silicon oxide film 70. Thereafter, an opening is formed on the bonding pad 14.

Since other portions are the same as portions in the sixth embodiment, the description thereof will be omitted.

According to the seventh embodiment, as described above, the silicon oxide film 70 is formed using an HDP-CVD method, whereon the silicon oxide film 72 is formed using a P-CVD method. Therefore, even when etching of the step (shoulder) portion of the fuse wiring 12 proceeds, and the fuse wiring 12 is exposed from the underlying silicon oxide film 70 during the formation of the silicon oxide film 70, the silicon oxide film 72 is formed thereon, whereby the exposed step portion can be covered. Therefore, since the exposure of the shoulder of the fuse wiring 12 can be inhibited, the reliability of the semiconductor device can be secured.

In addition, the effects same as the effects described in the sixth embodiment can be obtained in the semiconductor device 700 in the seventh embodiment.

In the semiconductor device 700, silicon nitride film may be formed on the uppermost layer as a passivation film in order to prevent the infiltration of moisture into the chip.

Since other parts are same as in the sixth embodiment, the description thereof will be omitted.

Eighth Embodiment

Figure 20:
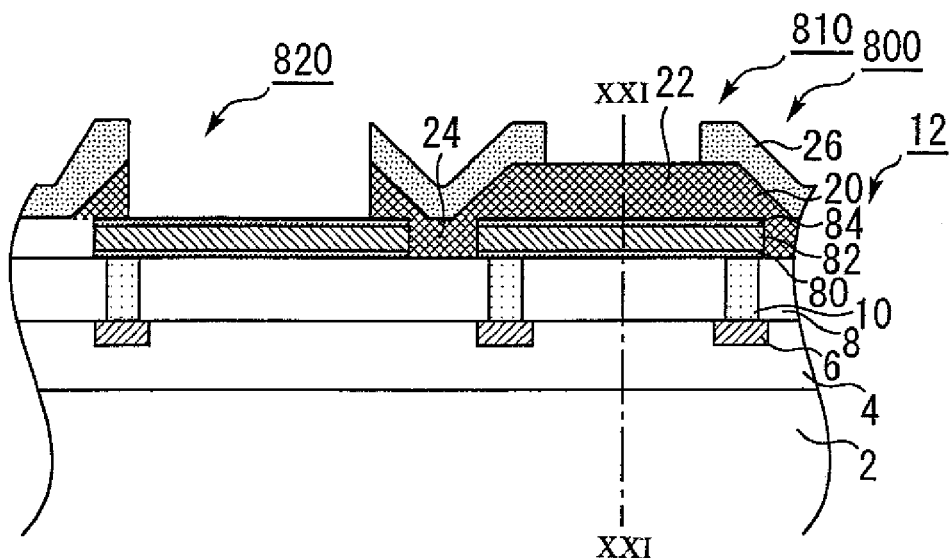
FIG. 20 is a schematic sectional view for illustrating a semiconductor device 800 in the eighth embodiment of the present invention.
Figure 21:
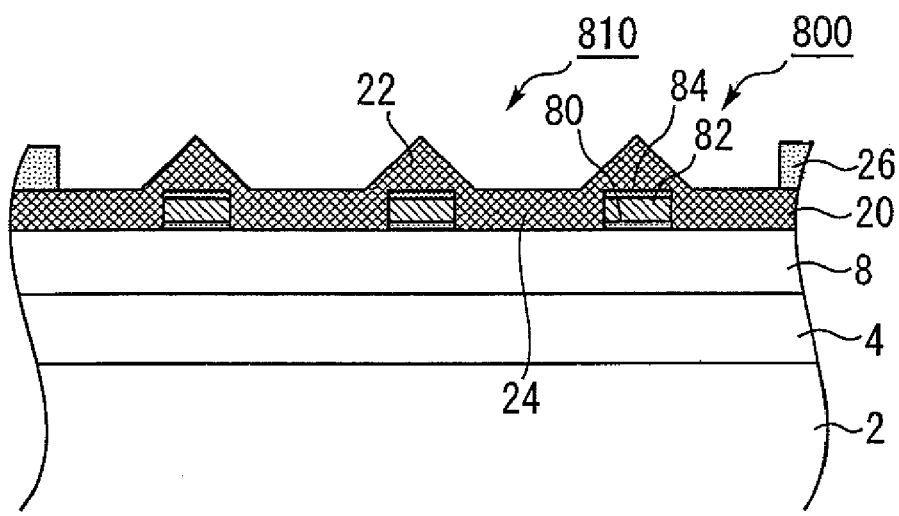
FIG. 21 is a schematic diagram showing the cross section of the semiconductor device 800 in FIG. 20 in the XXI-XXI direction.

FIG. 20 is a schematic sectional view for illustrating a semiconductor device 800 in the eighth embodiment of the present invention. FIG. 21 is a schematic diagram showing the cross section of the semiconductor device 800 in FIG. 20 in the XXI-XXI direction.

As FIGS. 19 and 20 show, the semiconductor device 800 resembles the semiconductor device 200. Similar to the semiconductor device 200, the semiconductor device 800 also includes an Si substrate 2, an interlayer insulating film 4, Cu wirings 6, an interlayer insulating film 8, and via holes 10 filled with tungsten. Also in the fuse portion 810, a fuse wiring 12 is formed, and in the bonding pad portion 820, a bonding pad 14 is formed. The fuse wiring 12 and the bonding pad 14 have the same thickness $d_f$ as in the first embodiment. As in the second embodiment, a silicon oxide film 20 having a ridged portion 22 and a flat portion 24, and a silicon nitride film 26 on the silicon oxide film 20 are formed on the wiring layer whereon the fuse wiring 12 and the bonding pad 14 are formed.

However, the fuse wiring 12 and the bonding pad 14 of the silicon oxide film 800 are the laminated structure of TiN/AlCu/TaN in this order from the top. Specifically, a TaN film 80 is formed on the surface of the interlayer insulating film 8, an AlCu film 82 is formed thereon, and a TiN film 84 is formed on the AlCu film 82.

Figure 22:
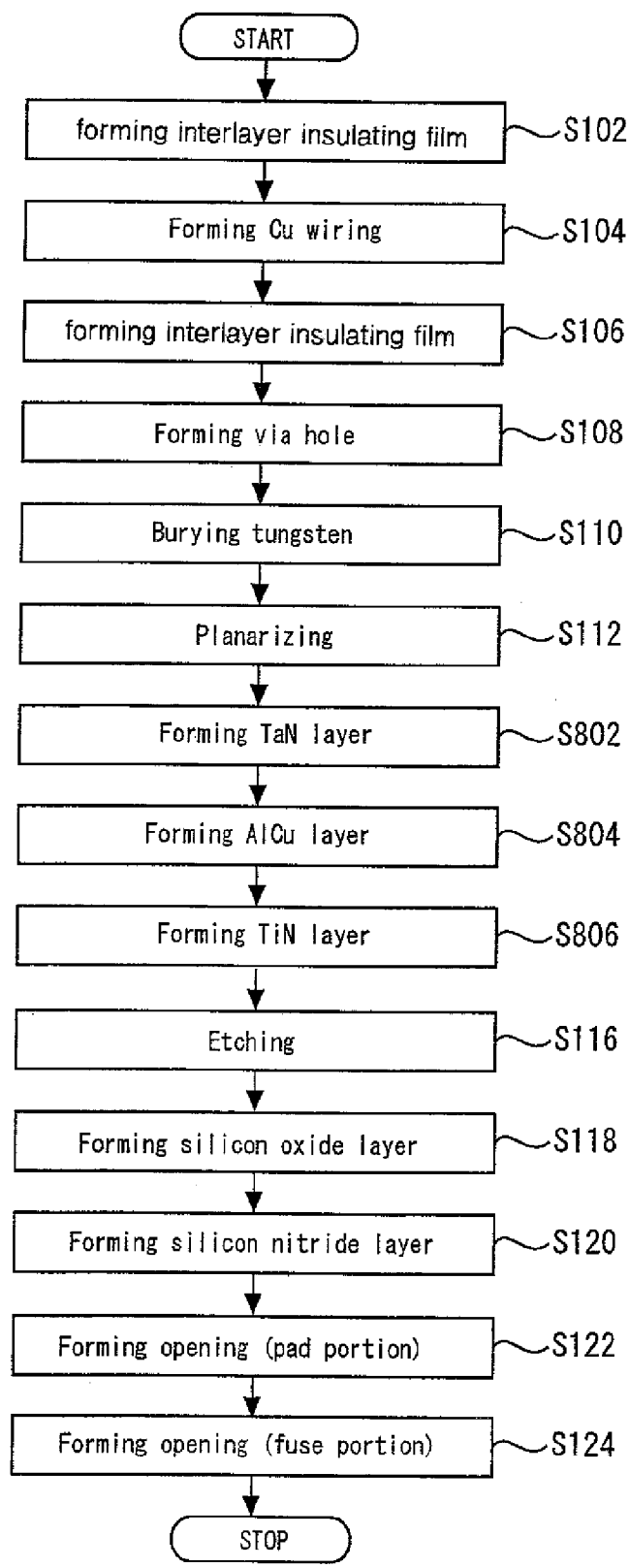
FIG. 22 is a flow diagram for illustrating the method for manufacturing the semiconductor device 800 in the eighth embodiment of the present invention.

FIG. 22 is a flow diagram for illustrating the method for manufacturing the semiconductor device 800 in the eighth embodiment of the present invention. The method for manufacturing the semiconductor device according to the eighth embodiment of the present invention will be described below referring to FIGS. 19 to 21.

The method for manufacturing the semiconductor device 800 resembles the method for manufacturing the semiconductor device 200. As in the semiconductor device 200, an interlayer insulating film 8 is formed by performing steps S102 to S114.

Next, a wiring layer for forming the fuse wiring 12 and the bonding pad 14 is formed. Specifically, a TaN film 80 is formed (Step S802), an AlCu film 82 is formed thereon (Step S804), and a TiN film 84 is formed on the AlCu film 82 (Step S806).

Next, as in the second embodiment, the wiring layer is etched to form the fuse wiring 12 and the bonding pad 14 (Step S116). Thereafter, a silicon oxide film 20 is formed using an HDP-CVD method, and a silicon nitride film 26 is formed using a P-CVD method. Then, openings are formed (Steps S122, S124), thereby, the semiconductor device 800 is formed.

In the eighth embodiment, as described above, the fuse wiring 12 and the bonding pad 14 have a laminated structure of TiN/AlCu/TaN. Although a laminated structure of TiN/AlCu/TiN/Ti has generally been used other than the structure of the Al wiring alone, there has been a problem that blow residues occur easily when the wiring of this structure is blown as a fuse. This is considered because the melting point of TiN is 2,932° C. and the melting point of Ti is 1,683° C., and two kinds of metals having different melting points are laminated under the Al wiring. Therefore, the semiconductor device 800, one metal, that is the TiN film 84 alone, is used as the underlying layer of the AlCu film 82. Also, TaN absorbs more laser beams than TiN. Therefore, according to the eighth embodiment, the semiconductor device 800 having good fuse-blow characteristics can be obtained.

Although the case wherein a fuse wiring 12 having a TiN/AlCu/TaN laminated structure is used is described in the eighth embodiment, the present invention is not limited thereto, but other metals may also be laminated.

For example, as a favorable laminated structure of the fuse wiring, TiN/AlCu/TaN/Ta can be considered. The melting point of Ta is 2,996° C., and the melting point of TaN is 3,088° C. Therefore, even if two kinds of metals are disposed underneath the AlCu film, the blow characteristics are not affected because the melting points of the both materials are relatively close to each other. In the eighth embodiment, via holes 10 filled with tungsten connect Cu wirings 6 to the fuse wiring 12. However, when such a structure is not used, but the fuse wiring 12 is directly connected to Cu wirings 6, due to insufficient contact to the Cu wirings 6, voids may occur in the boundary causing the defect of the semiconductor device. However, Ta adheres to Cu better than TaN, the use of the TaN/Ta laminated film can improve adhesion with the Cu wirings 6, and can further improve the reliability of the semiconductor device.

The examples of other structures as the fuse wiring 12 include TiN/AlCu/TiN/TaN, or TiN/AlCu/TiN/TaN/Ta. The melting point of TiN is 2,932° C., the melting point of TaN is 3,088° C., and the melting point of Ta is 2,996° C. Therefore, since the melting points of the three materials are relatively close to each other, the deterioration of blow characteristics can be inhibited. Also when the AlCu film directly contacts the TaN film wherein Ta is insufficiently nitrided, the reaction between Ta and Al may form AlTa to raise the resistance of via holes. However, according to this structure, direct contact of the AlCu film with the TaN film can be prevented. Therefore, a semiconductor device with more stable via resistance can be obtained.

As the other favorable laminated structures for the fuse wiring 12, TiN/AlCu/TiN/Ti/TaN/Ta can be considered. When a TaN/Ta film is formed, exposed to the atmosphere, and a TiN film is formed, the surface of the TaN film may become TaON, and the via resistance may elevate. However, according to this structure, a Ti film is formed on a TaN film, and then a TiN film is formed. Thereby the oxide layer is reduced, and the elevation of via resistance can be inhibited. Therefore, when the fuse wiring 12 of this structure is used, a semiconductor device having more stable via resistance can be obtained.

Since other effects are the same as effects described in the second embodiment, the description thereof will be omitted.

In the eighth embodiment, the case wherein the silicon oxide film 20 and the silicon nitride film 26 as described in the second embodiment is formed on the fuse wiring 12 of a laminated structure is described. However, in the present invention, the insulating film formed on the fuse wiring 12 is not limited thereto, but for example the insulating films as described in the first to seventh embodiments may also be formed.

Since other parts are same as in the second embodiment, the description thereof will be omitted.

Ninth Embodiment

Figure 23:
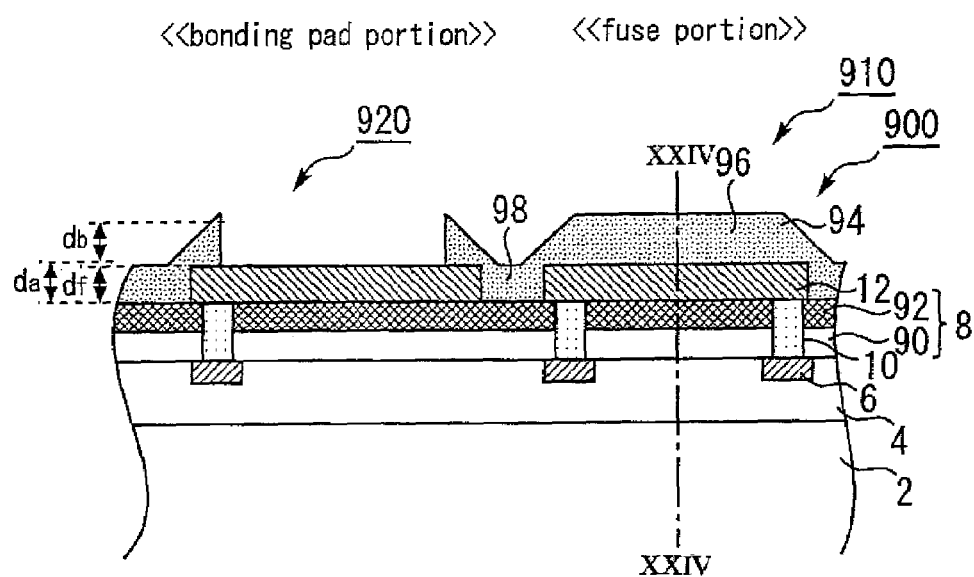
FIG. 23 is a schematic sectional view for illustrating a semiconductor device 900 in the ninth embodiment of the present invention.
Figure 24:
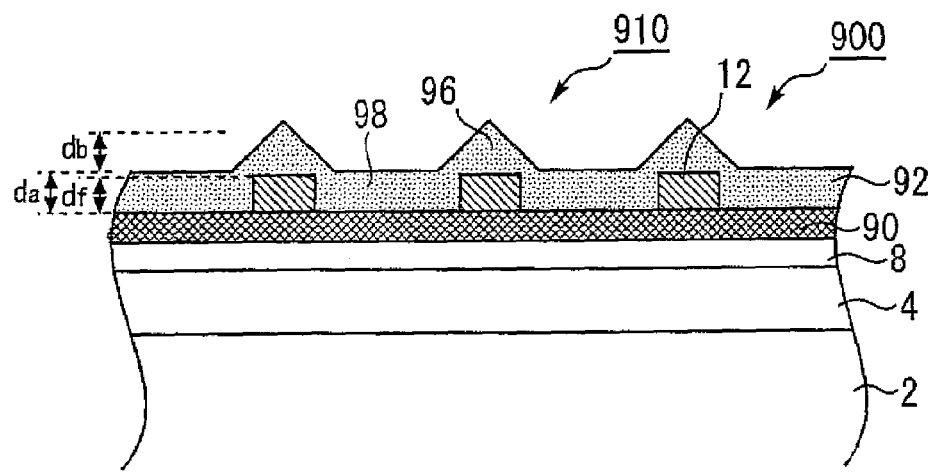
FIG. 24 is a schematic diagram showing the cross section of the semiconductor device 900 in FIG. 23 in the XXIV-XXIV direction.

FIG. 23 is a schematic sectional view for illustrating a semiconductor device 900 in the ninth embodiment of the present invention. FIG. 24 is a schematic diagram showing the cross section of the semiconductor device 900 in FIG. 23 in the XXIV-XXIV direction.

As FIGS. 22 and 23 show, the semiconductor device 900 resembles the semiconductor device 200. Similar to the semiconductor device 200, the semiconductor device 900 also includes an Si substrate 2, an interlayer insulating film 4, Cu wirings 6, an interlayer insulating film 8, and via holes 10 filled with tungsten. Also in the fuse portion 910, a fuse wiring 12 is formed, and in the bonding pad portion 920, a bonding pad 14 is formed. The fuse wiring 12 and the bonding pad 14 have the same thickness $d_f$ as in the first embodiment.

In the semiconductor device 900, however, the interlayer insulating film 8 is the laminate of a silicon nitride film 90 and a silicon oxide film 92. Via holes 10 are formed so as to pass through the silicon nitride film 90 and the silicon oxide film 92, and extend to the wiring layer 6. Here, the silicon nitride film 90 is formed so as to have a thickness of 100 nm or more to secure the function as a passivation film.

On the wiring layer whereon a bonding pad 14 and a fuse wiring 12 is formed a silicon oxide film 94. Similar to the silicon oxide film 20 in the semiconductor device 200, the silicon oxide film 94 has ridged portions 96 and flat portions 98, and has an opening on the portion whereon the bonding pad 14 is formed. Also in the semiconductor device 900, a silicon nitride film 90 is formed as the interlayer insulating film 8, and since the silicon nitride film 90 acts as a passivation film, no silicon nitride film is formed on the silicon oxide film 94.

Figure 25:
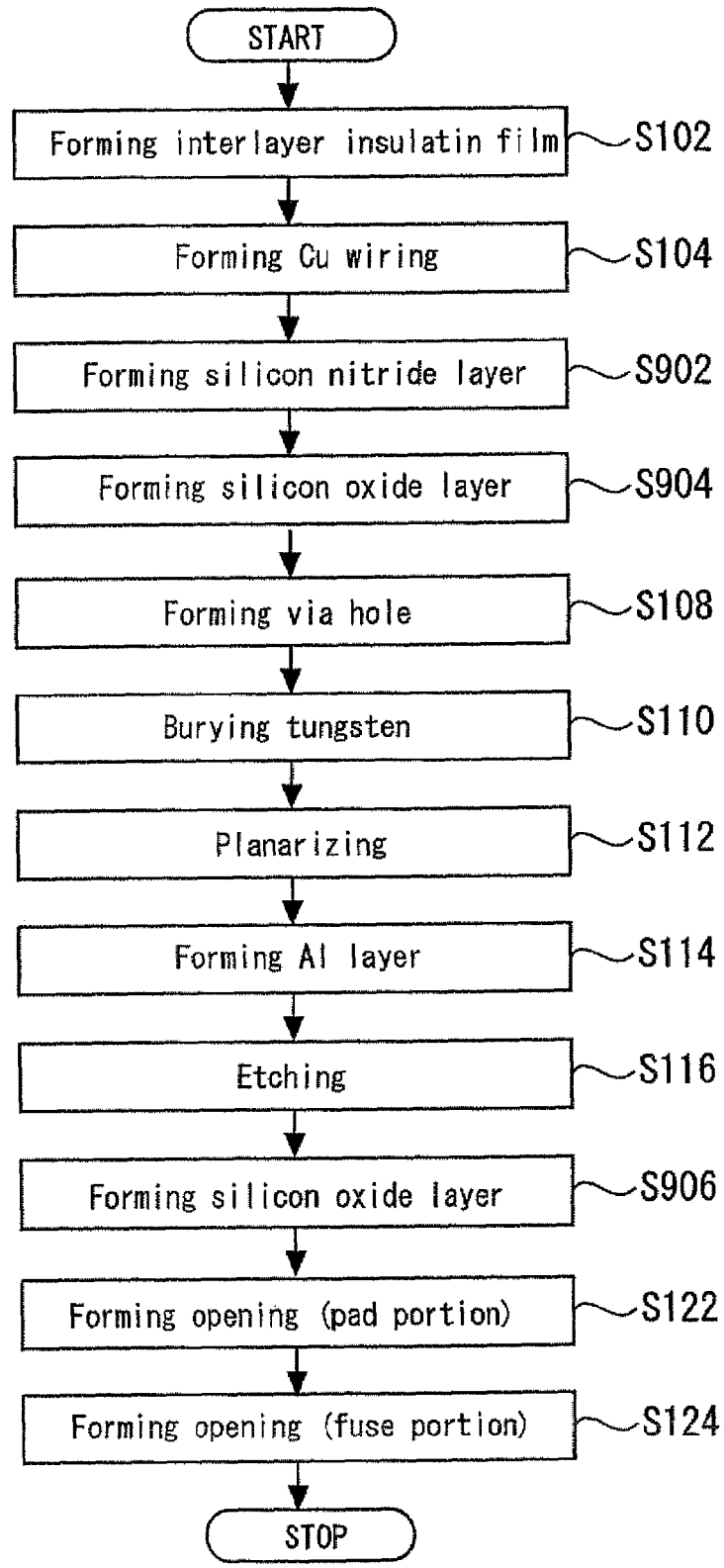
FIG. 25 is a flow diagram for illustrating the method for manufacturing the semiconductor device 900 in the ninth embodiment of the present invention.

FIG. 25 is a flow diagram for illustrating the method for manufacturing the semiconductor device 900 in the ninth embodiment of the present invention.

The method for manufacturing the semiconductor device 900 in the ninth embodiment of the present invention will be described below referring to FIGS. 22 to 24.

In the same manner as described in the second embodiment, an interlayer insulating film 4 is formed on a Si substrate 2, and a Cu wiring 6 is formed (Steps S102 to S104).

Thereafter, a silicon nitride film 90 is formed on the Cu wiring 6 and the interlayer insulating film 4 (Step S902) using a P-CVD method. The silicon nitride film 90 is formed so as to have a thickness of 100 nm or more. Next, a silicon oxide film 92 is formed on the silicon nitride film 90 using a P-CVD method (Step S904). Thereby, the silicon nitride film 90 and the silicon oxide film 92 are laminated to form the interlayer insulating film 8.

Next, via holes 10 passing through the silicon nitride film 90 and the silicon oxide film 92 are formed by etching (Step S108), and as in the second embodiment, steps S110 to S116 are performed to form the fuse wiring 12 and the bonding pad 14.

Thereafter, as in the second embodiment, a silicon oxide film 94 is formed on the wiring layer whereon the fuse wiring 12 is formed using an HDP-CVD method (Step S906). Here, the formed silicon oxide film 94 has flat portions 98 and ridged portions 96. Thereafter, an opening is formed in the silicon oxide film 94 so as to expose a part of the bonding pad 14 (Steps S122, S124).

As described above, the semiconductor device 900 is manufactured.

Here, since the silicon nitride film 90 is formed as the interlayer insulating film 8, no silicon nitride film acting as a passivation film is required to form on the silicon oxide film 94.

Since other parts are same as in the second embodiment, the description thereof will be omitted.

According to the ninth embodiment, the interlayer insulating film 8 between the Cu wiring 6 and the Al wiring such as the fuse wiring 12 has a laminated structure consisting of the silicon nitride film 90 and the silicon oxide film 92. Thereby, even if no silicon nitride film acting as a passivation film is formed on the uppermost layer, sufficient passivation characteristics, such as the prevention of the infiltration of moisture into the chip can be secured. It is considered that when a silicon nitride film is formed using a P-CVD method on a silicon oxide film formed on an Al wiring, the thickness of the silicon nitride film is reduced on the sides of the Al wiring leading to the lowering of passivation characteristics. In particular, since the distance between Al wirings is reduced when the pattern is miniaturized, the coverage of the silicon nitride film to the Al wiring leading may decline, and problems may arise. However, as described in the ninth embodiment, when apart of the interlayer insulating film 8 between the Cu wiring and the Al wiring is formed of the silicon nitride film 90, the semiconductor device 900 having sufficient passivation characteristics can be obtained.

Since other effects are same as the effects described in the second embodiment, the description thereof will be omitted.

In the ninth embodiment, a part of the interlayer insulating film 8 is formed of the silicon nitride film 90, the present invention is not limited thereto, but the entire interlayer insulating film 8 may have the structure formed of a silicon nitride film. Also, the present invention is not limited to the silicon nitride film, but other films may be used as long as passivation characteristics can be secured.

Also in the ninth embodiment, the case wherein a part of the interlayer insulating film 8 in the semiconductor device 200 described in the second embodiment is formed of a silicon nitride film is described. However, the present invention is not limited thereto, but can also be applied to other structures, for example, structures, as semiconductor device 100, 600, 700, wherein a silicon oxide film is formed on an Al wiring, or a part of an interlayer insulating film 8 is substituted by a silicon nitride film.

In the present invention, the lower-layer substrates include insulating films and metal wiring layers below the layer whereon a fuse wiring is formed, as well as an Si substrate, and for example, the Si substrate, the interlayer insulating film 4, the Cu wiring 6, and the interlayer insulating film 8 in first to ninth embodiments fall under this category. Also in the present invention, for example, silicon oxide films 40, 50, 62, and 70 in fourth, fifth, sixth, and seventh embodiments fall under the first insulating film; and for example, silicon nitride films 42 and 56, or silicon oxide films 64 and 72 in fourth, fifth, sixth, and seventh embodiments fall under the second insulating film.

The fuse forming process of the present invention is implemented by performing steps S114 and S116 in first to seventh and ninth embodiments, or steps S802, S804 and S116 in the eighth embodiment. Also, the silicon oxide film forming process is implemented by performing, for example, step S118 in the first embodiment, the silicon nitride film forming process is implemented by performing, for example, step S120; and the opening forming process is implemented by performing, for example, step S124.

The features and the advantages of the present invention as described above may be summarized as follows.

According to one aspect of the present invention, the insulating films on the surface of the lower-layer substrate and the fuse are formed so that the thickness of the insulating film on the lower-layer substrate is thicker than the fuse. Thereby, when the fuse is blown, damage to adjacent fuses can be inhibited, and fuse blow can be properly performed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-101762, filed on Apr. 4, 2003 including specification, claims, drawings and summary, on which the Convention priority of the present application is based, are incorporated herein by reference in its entirety.

The invention claimed is:

1. A method of manufacturing a semiconductor device comprising:
    forming a first insulating film supported by a semiconductor substrate;
    forming an aluminum layer supported by said first insulating film;
    etching said aluminum layer to form a bonding pad and a fuse element;
    depositing by plasma chemical vapor deposition a second insulating film, covering said bonding pad and said fuse element, said second insulating film having a planar portion, between said fuse element and said bonding pad, and ridged portions, opposite said fuse element;
    depositing by plasma chemical vapor deposition a third insulating film covering said second insulating film;
    etching said third insulating film to form a first hole exposing a first region of said second insulating film, opposite said fuse element, and a second hole exposing a second region of said second insulating film, opposite at least part of said bonding pad; and
    etching said second insulating film to expose at least part of said bonding pad, wherein
        said fuse element is electrically opened by irradiation with laser light that melts and thereby cuts said fuse element, and
        said fuse element is thinner than total thickness of (i) said third insulating film, at a location between said fuse element and said bonding pad, and (ii) said second insulating film, at a location between said fuse element and said bonding pad.

2. The method of manufacturing a semiconductor device according to claim 1, including depositing silicon oxide as said second insulating film.

3. The method of manufacturing a semiconductor device according to claim 2, including depositing silicon nitride as said third insulating film.

* * * * *